(12) United States Patent
Oh

(10) Patent No.: US 12,142,314 B2
(45) Date of Patent: Nov. 12, 2024

(54) SEMICONDUCTOR DIE FOR CONTROLLING ON-DIE-TERMINATION OF ANOTHER SEMICONDUCTOR DIE, AND SEMICONDUCTOR DEVICES INCLUDING THE SAME

(71) Applicant: Samsung Electronics Co., Ltd., Suwon-si (KR)

(72) Inventor: Taeyoung Oh, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 114 days.

(21) Appl. No.: 18/154,945

(22) Filed: Jan. 16, 2023

(65) Prior Publication Data

US 2023/0343386 A1 Oct. 26, 2023

(30) Foreign Application Priority Data

Apr. 20, 2022 (KR) .................. 10-2022-0048958
Jun. 28, 2022 (KR) .................. 10-2022-0079252

(51) Int. Cl.
*G11C 11/4097* (2006.01)
*G11C 7/10* (2006.01)
(Continued)

(52) U.S. Cl.
CPC ........ *G11C 11/4093* (2013.01); *G11C 7/1051* (2013.01); *G11C 7/109* (2013.01); *G11C 11/4076* (2013.01); *H01L 23/481* (2013.01); *H03K 19/0175* (2013.01); *H10B 80/00* (2023.02)

(58) Field of Classification Search
CPC ... G11C 11/4093; G11C 7/1051; G11C 7/109; G11C 11/4076; G11C 7/1066; G11C 7/1093; G11C 2207/2272; G11C 5/04; G11C 7/1057; G11C 7/1084; G11C 7/222;
(Continued)

(56) References Cited

U.S. PATENT DOCUMENTS 7,180,327 B2   2/2007   So et al.
7,268,712 B1   9/2007   Sheen
(Continued)

FOREIGN PATENT DOCUMENTS

EP         3761184 A1    1/2021
KR     100604843 B1      7/2006
(Continued)

OTHER PUBLICATIONS

Ahn, et al., "Improving System Energy Efficiency with Memory Rank Subsetting", ACM Transactions on Architecture and Code Optimization, 9(1), 2012, 1-28.

*Primary Examiner* — Fernando Hidalgo
(74) *Attorney, Agent, or Firm* — Myers Bigel, P.A.

(57) ABSTRACT

A semiconductor die includes a first pin configured to output a first on-die termination (ODT) control signal to a second semiconductor die, the second semiconductor die comprising a plurality of second ODT circuits each having an ODT that is responsive to the first ODT control signal; and a second pin configured to receive a second ODT control signal output from the second semiconductor die, the semiconductor die comprising a plurality of first ODT circuits each having an ODT that is responsive to the second ODT control signal.

20 Claims, 11 Drawing Sheets

(51) Int. Cl.
*G11C 11/4076* (2006.01)
*G11C 11/4093* (2006.01)
*H01L 23/48* (2006.01)
*H03K 19/0175* (2006.01)
*H10B 80/00* (2023.01)

(58) Field of Classification Search
CPC .............. H01L 23/481; H03K 19/0175; H03K 19/0005; H10B 80/00
USPC .................................................. 365/189.011
See application file for complete search history.

(56) References Cited

U.S. PATENT DOCUMENTS

| | | | |
|---|---|---|---|
| 7,602,056 B2 | 10/2009 | Zhao et al. | |
| 7,679,198 B2 | 3/2010 | Anderson et al. | |
| 8,619,492 B2 | 12/2013 | Jeon | |
| 9,660,648 B2 | 5/2017 | Oh et al. | |
| 9,747,230 B2 | 8/2017 | Han et al. | |
| 9,871,519 B2 | 1/2018 | Bains et al. | |
| 10,643,676 B2 | 5/2020 | Mobin et al. | |
| 11,342,038 B2* | 5/2022 | Kim | G11C 7/1057 |
| 2007/0126463 A1 | 6/2007 | Cox et al. | |
| 2009/0224822 A1 | 9/2009 | Alzheimer et al. | |
| 2009/0309628 A1* | 12/2009 | Hyun | H03K 19/0005 326/30 |
| 2013/0002291 A1* | 1/2013 | Park | H03K 19/003 326/30 |
| 2014/0062528 A1* | 3/2014 | Park | G11C 7/1057 326/30 |
| 2017/0178750 A1* | 6/2017 | Kang | G11C 11/4093 |
| 2017/0194962 A1* | 7/2017 | Bains | G06F 3/0673 |
| 2018/0039588 A1* | 2/2018 | Yun | G11C 11/406 |
| 2018/0336958 A1* | 11/2018 | Kim | G11C 29/025 |
| 2018/0342274 A1* | 11/2018 | Son | H03H 7/38 |
| 2019/0139592 A1* | 5/2019 | Bains | G11C 7/109 |
| 2020/0358441 A1 | 11/2020 | Oh et al. | |
| 2021/0020227 A1* | 1/2021 | Lee | G11C 29/028 |
| 2021/0151117 A1* | 5/2021 | Kim | G11C 16/26 |
| 2022/0057965 A1 | 2/2022 | Hwang et al. | |

FOREIGN PATENT DOCUMENTS

| | | |
|---|---|---|
| KR | 101789077 B1 | 11/2017 |
| KR | 20220022407 A | 2/2022 |
| TW | 200742028 A | 11/2007 |
| TW | 200952145 A | 12/2009 |

* cited by examiner

FIG. 13
|  | IDLE | WRITE | READ |
|---|---|---|---|
| TARGET | 40 Ω | OFF | OFF |
| NON-TARGET | 40 Ω | 40 Ω | OFF/240 Ω |
FIG. 14
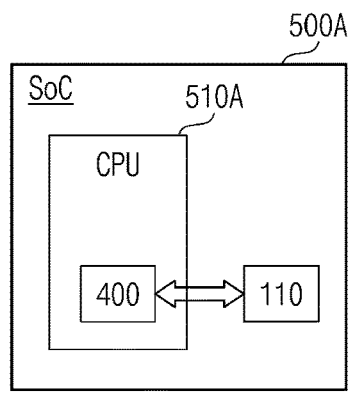
FIG. 15
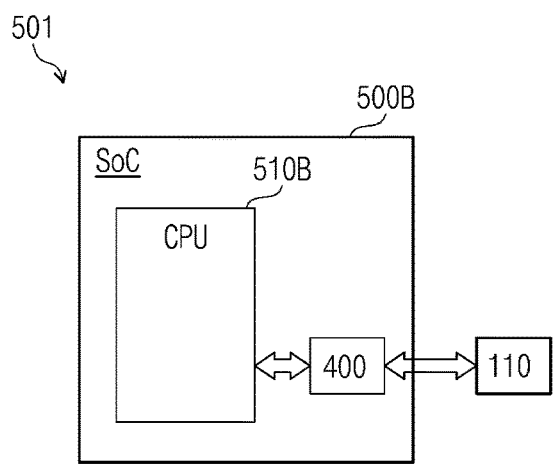

SEMICONDUCTOR DIE FOR CONTROLLING ON-DIE-TERMINATION OF ANOTHER SEMICONDUCTOR DIE, AND SEMICONDUCTOR DEVICES INCLUDING THE SAME

CROSS-REFERENCE TO RELATED APPLICATIONS

This application claims priority under 35 U.S.C. § 119 to Korean Patent Application Nos. 10-2022-0048958 filed on Apr. 20, 2022, and 10-2022-0079252 filed on Jun. 28, 2022, in the Korean Intellectual Property Office, the disclosures of which are incorporated by reference herein in their entireties.

BACKGROUND

Embodiments of the present disclosure described herein relate to a semiconductor die, and more particularly, relate to a semiconductor die configured to control on-die termination (ODT) of another semiconductor die and semiconductor devices including the same.

Even though termination resistors on a mother board may be capable of reducing the reflection of some signals on signal lines, the termination resistors may fail to prevent the signal reflection caused by stub lines connected to components of a module card (e.g., a DRAM module).

A signal that is propagated from a controller to the components of the module card may experience the impedance discontinuity at the stub (or a connection node) connected to the components. The signal that is propagated to components (e.g., components of a DRAM) along the signal line and the stub may again be reflected to the signal line, thereby causing the introduction of unintended noise to the signal.

However, according to on-die termination (ODT) technology, a termination resistor for impedance matching of a transmission line may be disposed within a semiconductor chip (or a semiconductor die), which is not on a printed circuit board (PCB) or the mother board.

Accordingly, the ODT may reduce the number of resistor elements disposed on the mother board and the complex wiring. As a result, the ODT may make a system design simpler and more cost effective.

SUMMARY

Some embodiments of the present disclosure may provide a semiconductor die controlling on-die termination (ODT) of another semiconductor die to reduce power consumption, and semiconductor devices including the same.

According to an embodiment, a semiconductor die includes a first pin configured to output a first on-die termination (ODT) control signal to a second semiconductor die, the second semiconductor die comprising a plurality of second ODT circuits each having an ODT that is responsive to the first ODT control signal; and a second pin configured to receive a second ODT control signal output from the second semiconductor die, the semiconductor die comprising a plurality of first ODT circuits each having an ODT that is responsive to the second ODT control signal.

The semiconductor die further includes an ODT control signal generation circuit that is configured to generate the first ODT control signal, which is activated before a first bit of read data corresponding to a burst length is output from the semiconductor die when performing a first read operation and is deactivated after a last bit of the read data is output and is further configured to output the first ODT control signal to the first pin.

According to an embodiment, a multi-chip package includes a first semiconductor die; and a second semiconductor die. The first semiconductor die includes: a first pin configured to output a first on-die termination (ODT) control signal to the second semiconductor die, the second semiconductor die comprising a plurality of second ODT circuits each having an ODT that is responsive to the first ODT control signal; and a second pin configured to receive a second ODT control signal output from the second semiconductor die, the first semiconductor die comprising a plurality of first ODT circuits each having an ODT that is responsive to the second ODT control signal.

The second semiconductor die includes a third pin that is configured to receive the first ODT control signal output from the first semiconductor die, and a fourth pin that is configured to output the second ODT control signal to the first semiconductor die.

According to an embodiment, a memory system includes a multi-chip package including a first semiconductor die and a second semiconductor die; and a memory controller configured to control an operation of the multi-chip package. The first semiconductor die includes: a first pin configured to output a first on-die termination (ODT) control signal to the second semiconductor die, the second semiconductor die comprising a plurality of second ODT circuits each having an ODT that is responsive to the first ODT control signal; and a second pin configured to receive a second ODT control signal output from the second semiconductor die, the first semiconductor die comprising a plurality of first ODT circuits each having an ODT that is responsive to the second ODT control signal.

The second semiconductor die includes a third pin that is configured to receive the first ODT control signal output from the first semiconductor die, and a fourth pin that is configured to output the second ODT control signal to the first semiconductor die.

BRIEF DESCRIPTION OF THE FIGURES

The above and other objects and features of the present disclosure will become apparent by describing in detail embodiments thereof with reference to the accompanying drawings.

FIG. 13 illustrates a table including ODT control results of an ODT circuit for respective operation states of a target and a non-target.

FIG. 14 is a block diagram of a data processing system including a memory system illustrated in FIG. 1.

FIG. 15 is a block diagram of a data processing system including a memory system illustrated in FIG. 1.

DETAILED DESCRIPTION

Figure 1:
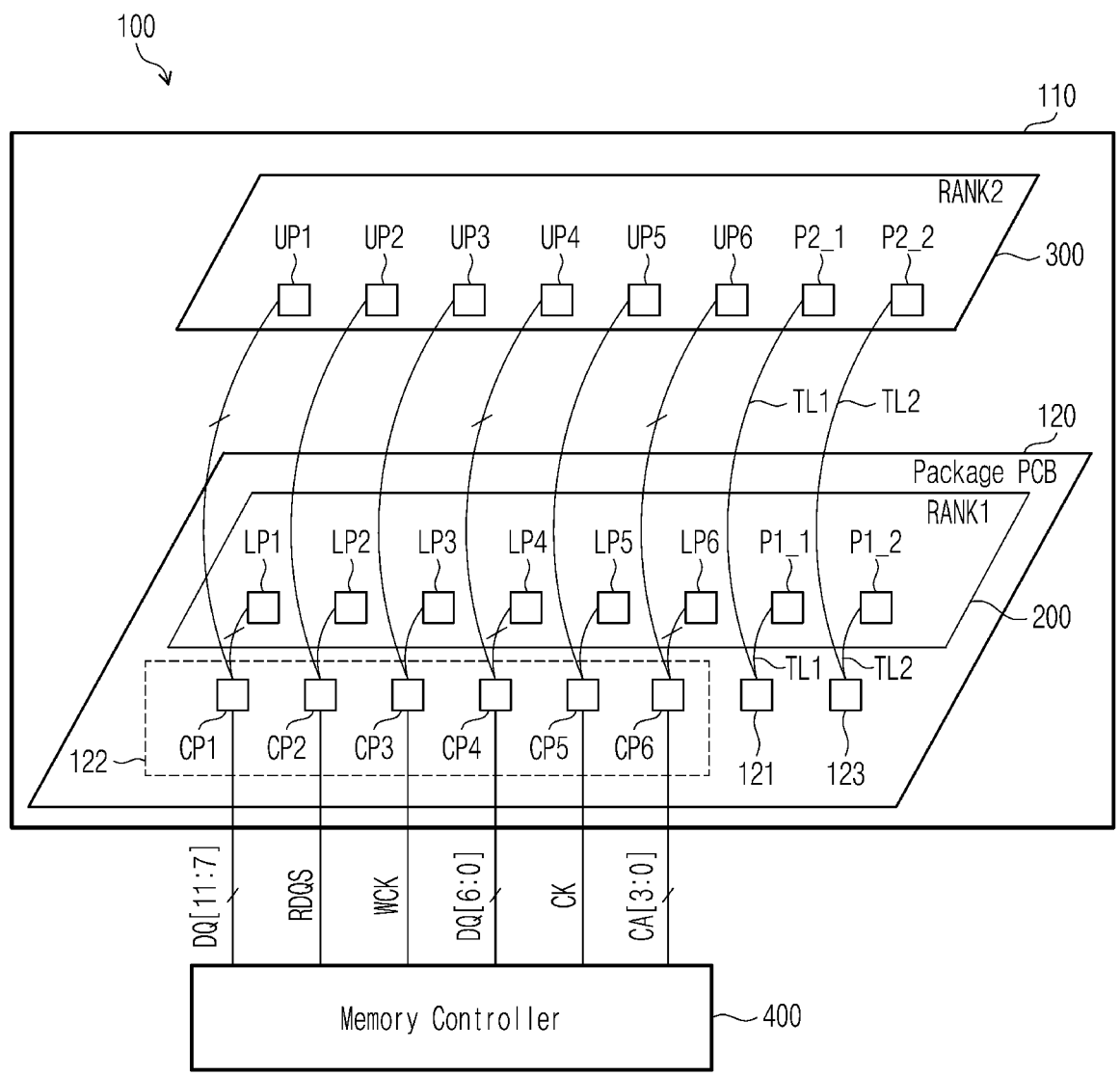
FIG. 1 is a block diagram of a memory system including semiconductor dies according to an embodiment of the present disclosure.

Hereinafter, example embodiments will be described with reference to the accompanying drawings. The present inventive subject matter may, however, be embodied in many different forms and should not be construed as limited to the embodiments set forth herein. In the drawings, like numerals refer to like elements throughout the description and repeated descriptions may be omitted. It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

FIG. 1 is a block diagram of a memory system including semiconductor dies according to an embodiment of the present disclosure.

Referring to FIG. 1, a memory system 100 includes a memory device 110 and a memory controller 400, and the memory device 110 includes a printed circuit board (PCB) 120, a first semiconductor die 200, and a second semiconductor die 300.

In the example of a dynamic random access memory (DRAM), to expand (or increase) the memory capacity of the memory device 110, a 2-rank configuration where the two semiconductor dies 200 and 300 are connected in parallel with an input/output interface 122 may be used. For example, each of the semiconductor dies 200 and 300 may be a low-power double data rate (LPDDR) DRAM or an LPDDR synchronous DRAM (SDRAM).

In the specification, a semiconductor die means a die, a semiconductor chip, an integrated circuit (IC), or the like. According to embodiments, the memory device 110 may mean a multi-chip package, a semiconductor package, a memory module, or the like.

The PCB 120 includes a first connection pin 121, the input/output interface 122, and a second connection pin 123.

The input/output interface 122 includes first data input/output pads CP1, a read data strobe signal pad CP2, a write clock signal pad CP3, second data input/output pads CP4, a clock signal pad CP5, and command/address pads CP6. For example, when each of the pads CP2, CP3, and CP5 refers a pad associated with the transfer of multiple differential signals, each of the pads CP2, CP3, and CP5 means a plurality of pads.

The first data input/output pads CP1 are pads for the input/output of a first group of data DQ[11:7]; the read data strobe signal pad CP2 is a pad for the transmission of a read data strobe signal RDQS associated with a read operation; the write clock signal pad CP3 is a pad for the transmission of a write clock signal WCK associated with a write operation; the second data input/output pads CP4 are pads for the input/output of a second group of data DQ[6:0]; the clock signal pad CP5 is a pad for the transmission of a clock signal CK; and, the command/address pads CP6 are pads for the transmission of command signals or addresses CA[3:0]. In this example, the command signals mean signals associated with a read command or a write command.

Because numbers (e.g., 11, 7, 6, 3, and 0) included in the first group of data DQ[11:7], the second group of data DQ[6:0], and the command signals or addresses CA[3:0] disclosed in the specification are numbers disclosed as an example for convenience of description, the numbers (e.g., 11, 7, 6, 3, and 0) may be changed in accordance with different embodiments.

According to embodiments, a configuration of each of the data input/output pads CP1 and CP4 associated with the input/output of the data DQ[11:7] and DQ[6:0] may be different from a configuration of each of the pads CP2, CP3, CP5, and CP6. According to embodiments, a pad may also be simply called a pin.

In FIG. 1, pads LP1 to LP6 included in the first semiconductor die 200 used as a first rank RANK1 are electrically connected with the pads CP1 to CP6, respectively, of the input/output interface 122 through the wire bonding, and pads UP1 to UP6 included in the second semiconductor die 300 used as a second rank RANK2 are electrically connected with the pads CP1 to CP6, respectively, of the input/output interface 122 through the wire bonding. According to embodiments, a configuration of each of the pads LP1, LP4, UP1, and UP4 may be different from a configuration of each of the pads LP2, LP3, LP5, LP6, UP2, UP3, UP5, and UP6.

A first pin P1_1 of the first semiconductor die 200 is electrically connected with the first connection pin 121 through the wire bonding, and the first connection pin 121 is electrically connected with a third pin P2_1 of the second semiconductor die 300 through the wire bonding. A transmission line electrically connecting the pins P1_1 and P2_1 and the first connection pin 121 is referred to as a "first transmission line TL1."

Also, a second pin P1_2 of the first semiconductor die 200 is electrically connected with the second connection pin 123 through the wire bonding, and the second connection pin 123 is electrically connected with a fourth pin P2_2 of the second semiconductor die 300 through the wire bonding. A transmission line electrically connecting the pins P1_2 with the P2_2 and the second connection pin 123 is referred to as a "second transmission line TL2."

In the specification, two pins may be additionally disposed (or formed) for each of the semiconductor dies 200 and 300. That is, the two pins P1_1 and P1_2 may be disposed (or formed) in the semiconductor die 200, and the two pins P2_1 and P2_2 may be disposed (or formed) in the semiconductor die 300.

Figure 2:
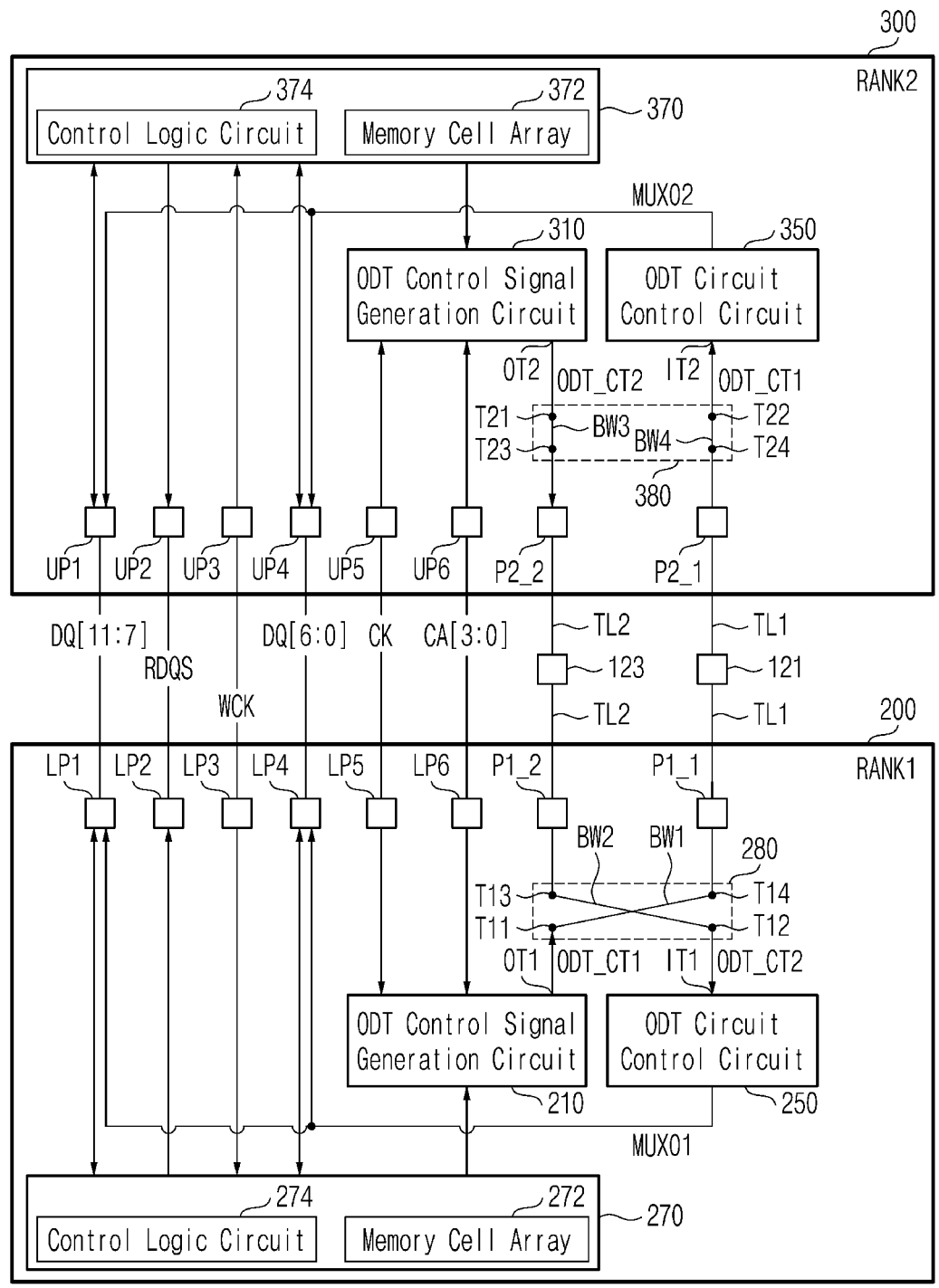
FIG. 2 is a conceptual diagram illustrating a connection relationship between a first semiconductor die and a second semiconductor die when the first semiconductor die of FIG. 1 is used as a first rank.
Figure 3:
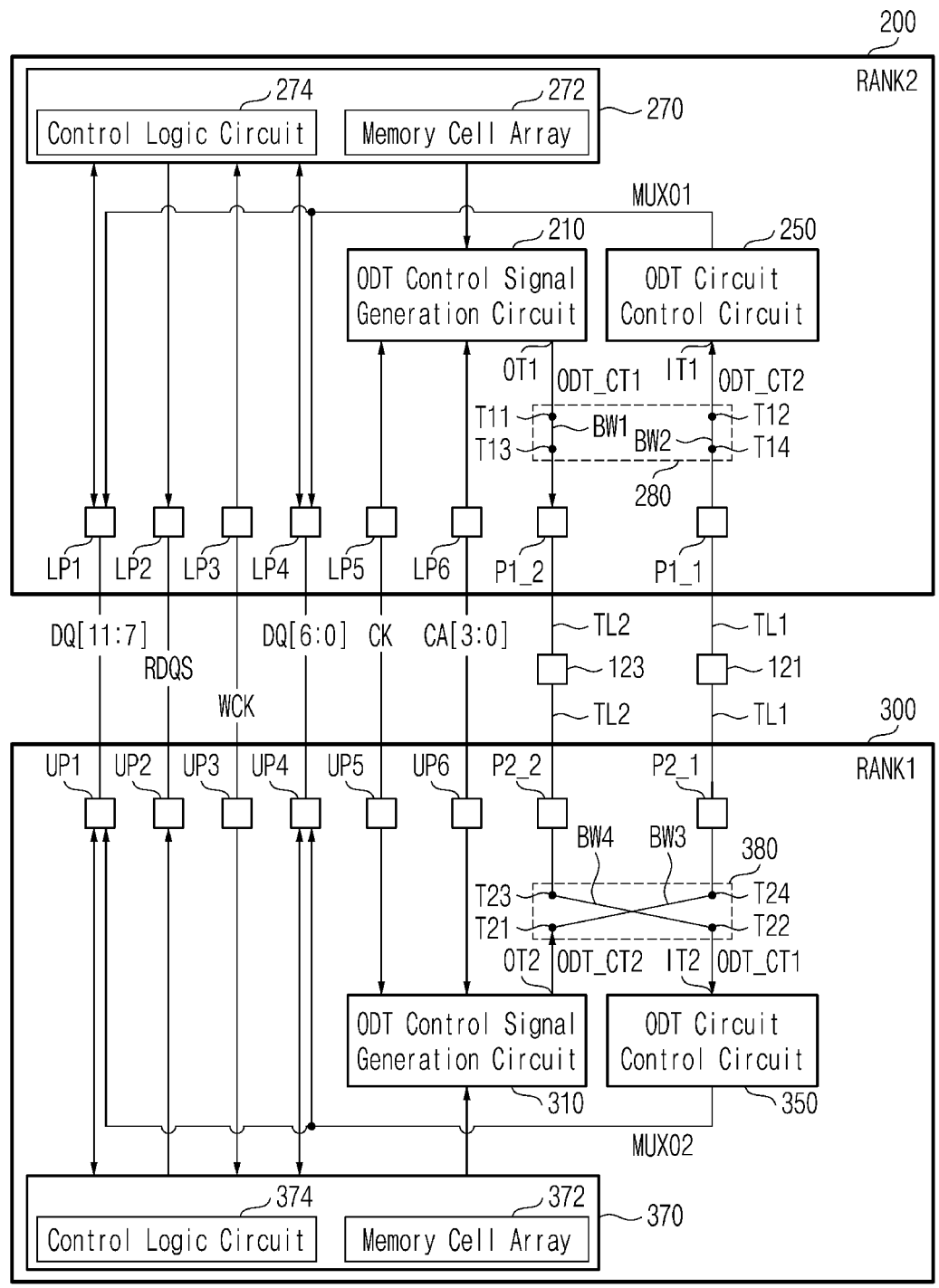
FIG. 3 is a conceptual diagram illustrating a connection relationship between a first semiconductor die and a second semiconductor die when the second semiconductor die of FIG. 1 is used as a first rank.

FIG. 2 is a conceptual diagram illustrating a connection relationship between a first semiconductor die and a second semiconductor die when the first semiconductor die of FIG. 1 is used as a first rank, and FIG. 3 is a conceptual diagram illustrating a connection relationship between a first semiconductor die and a second semiconductor die when the second semiconductor die of FIG. 1 is used as a first rank.

Referring to FIGS. 1 to 3, the semiconductor dies 200 and 300 may be manufactured to have the same physical configuration. That is, an ODT control signal generation circuit 210, an ODT circuit control circuit 250, a logic circuit and memory cell array 270, and a connection circuit 280 are manufactured to have the same structures as an ODT control signal generation circuit 310, an ODT circuit control circuit 350, a logic circuit and memory cell array 370, and a connection circuit 380.

After the semiconductor dies 200 and 300 are individually manufactured, connection relationships of the connection circuits 280 and 380 are determined based on whether each of the semiconductor dies 200 and 300 is used as the first rank RANK1 or the second rank RANK2 by bonding wires or cutting fuses.

The first semiconductor die 200 includes the plurality of pads LP1 to LP6, the first pin P1_1, the second pin P1_2, the first ODT control signal generation circuit 210, the first ODT circuit control circuit 250, the first logic circuit and memory cell array 270, and the first connection circuit 280.

The first logic circuit and memory cell array 270 includes a memory cell array 272 including a plurality of memory cells, and a control logic circuit 274 configured to control the write operation and the read operation associated with the memory cell array 272.

For example, in a write operation requested by the memory controller 400, the control logic circuit 274 writes the data DQ[11:0] output from the memory controller 400 in the memory cell array 272; in a read operation requested by the memory controller 400, the control logic circuit 274 reads the data from the memory cell array 272 and transfers the read data DQ[11:0] to the memory controller 400.

Also, under control of the memory controller 400, the control logic circuit 274 is configured to control an operation of the first ODT control signal generation circuit 210 (e.g., an operation of generating respective selection signals TRAIN_ON, SELN, SELP, SELN', and SELP').

The second semiconductor die 300 includes the plurality of pads UP1 to UP6, the third pin P2_1, the fourth pin P2_2, the second ODT control signal generation circuit 310, the second ODT circuit control circuit 350, the second logic circuit and memory cell array 370, and the second connection circuit 380.

The second logic circuit and memory cell array 370 includes a memory cell array 372 including a plurality of memory cells, and a control logic circuit 374 configured to control the write operation and the read operation associated with the memory cell array 372.

For example, in a write operation requested by the memory controller 400, the control logic circuit 374 writes the data DQ[11:0] output from the memory controller 400 in the memory cell array 372; in a read operation requested by the memory controller 400, the control logic circuit 274 reads the data from the memory cell array 372 and transfers the read data DQ[11:0] to the memory controller 400.

Also, under control of the memory controller 400, the control logic circuit 374 is configured to control an operation of the second ODT control signal generation circuit 310 (e.g., an operation of generating respective selection signals TRAIN_ON, SELN, SELP, SELN', and SELP').

In the write operation or the read operation, the command signals and addresses output from the memory controller 400 are transferred to the respective control logic circuits 274 and 374 through the command/address pads CP6.

As illustrated in FIG. 2, the first semiconductor die 200 is used as the first rank RANK1, and the second semiconductor die 300 is used as the second rank RANK2. However, as illustrated in FIG. 3, the first semiconductor die 200 is used as the second rank RANK2, and the second semiconductor die 300 is used as the first rank RANK1.

The first connection circuit 280 includes a first group of terminals T11, T12, T13, and T14; depending on whether the first semiconductor die 200 is used as the first rank RANK1 or the second rank RANK2, the first terminal T11 is connected with the fourth terminal T14 or the third terminal T13, and the second terminal T12 is connected with the third terminal T13 or the fourth terminal T14.

As illustrated in FIG. 2, the first terminal T11 and the fourth terminal T14 are connected by using a wire bonding BW1; in other embodiments, as illustrated in FIG. 3, the first terminal T11 and the third terminal T13 are connected. Also, as illustrated in FIG. 2, the second terminal T12 and the third terminal T13 are connected by using a wire bonding BW2; in other embodiments, as illustrated in FIG. 3, the second terminal T12 and the fourth terminal T14 are connected by using the wire bonding BW2.

According to embodiments, when a first fuse is connected between the first terminal T11 and the fourth terminal T14 and a second fuse is connected between the first terminal T11 and the third terminal T13, a desired connection may be formed based on whether the first fuse or the second fuse is cut. Also, when a third fuse is connected between the second terminal T12 and the third terminal T13 and a fourth fuse is connected between the second terminal T12 and the fourth terminal T14, a desired connection may be formed based on whether the third fuse or the fourth fuse is cut.

According to embodiments, the desired connections may be formed by using a first anti-fuse to a fourth anti-fuse instead of the first fuse to the fourth fuse.

The second connection circuit 380 includes a second group of terminals T21, T22, T23, and T24; depending on whether the second semiconductor die 300 is used as the first rank RANK1 or the second rank RANK2, the first terminal T21 is connected with the third terminal T23 or the fourth terminal T24, and the second terminal T22 is connected with the third terminal T23 or the fourth terminal T24.

As illustrated in FIG. 2, the first terminal T21 and the third terminal T23 are connected by using a wire bonding BW3; in other embodiments, as illustrated in FIG. 3, the first terminal T21 and the fourth terminal T24 are connected. Also, as illustrated in FIG. 2, the second terminal T22 and the fourth terminal T24 are connected by using a wire bonding BW4; in other embodiments, as illustrated in FIG. 3, the second terminal T22 and the third terminal T23 are connected by using the wire bonding BW4.

According to embodiments, when a fifth fuse is connected between the first terminal T21 and the fourth terminal T24 and a sixth fuse is connected between the first terminal T21 and the third terminal T23, a desired connection may be formed based on whether the fifth fuse or the sixth fuse is cut. Also, when a seventh fuse is connected between the second terminal T22 and the third terminal T23 and an eighth fuse is connected between the second terminal T22 and the fourth terminal T24, a desired connection may be formed based on whether the seventh fuse or the eighth fuse is cut.

According to embodiments, the desired connections may be formed by using a fifth to an eighth anti-fuse instead of the fifth fuse to the eighth fuse.

As illustrated in FIG. 2, when the first semiconductor die 200 is used as the first rank RANK1, in the first group of terminals T11, T12, T13, and T14, the two terminals T11 and T14 are connected, and the two terminals T12 and T13 are connected.

As illustrated in FIG. 2, when the second semiconductor die 300 is used as the second rank RANK2, in the second group of terminals T21, T22, T23, and T24, the two terminals T21 and T23 are connected, and the two terminals T22 and T24 are connected.

As illustrated in FIG. 3, when the second semiconductor die 300 is used as the first rank RANK1, in the second group of terminals T21, T22, T23, and T24, the two terminals T21 and T24 are connected, and the two terminals T22 and T23 are connected.

As illustrated in FIG. 3, when the first semiconductor die 200 is used as the second rank RANK2, in the first group of terminals T11, T12, T13, and T14, the two terminals T11 and T13 are connected, and the two terminals T12 and T14 are connected.

In FIG. 2, the first pin P1_1 is used as an output pin that is configured to output a first ODT control signal ODT_CT1 to the second rank RANK2 (or the second semiconductor die 300), and the third pin P2_1 is used as an input pin that is configured to receive the first ODT control signal ODT_CT1 output from the first rank RANK1 (or the first semiconductor die 200).

However, in FIG. 3, the first pin P1_1 is used as an input pin that is configured to receive a second ODT control signal ODT_CT2 output from the first rank RANK1 (or the second semiconductor die 300), and the third pin P2_1 is used as an output pin that is configured to output the second ODT control signal ODT_CT2 to the second rank RANK2 (or the first semiconductor die 200).

Also, in FIG. 2, the second pin P1_2 is used as an input pin that is configured to receive the second ODT control signal ODT_CT2 output from the second rank RANK2 (or the second semiconductor die 300), and the fourth pin P2_2 is used as an output pin that is configured to output the second ODT control signal ODT_CT2 to the first rank RANK1 (or the first semiconductor die 200); however, in FIG. 3, the second pin P1_2 is used as an output pin that is configured to output the first ODT control signal ODT_CT1 to the first rank RANK1 (or the second semiconductor die 300), and the fourth pin P2_2 is used as an input pin that is configured to receive the first ODT control signal ODT_CT1 output from the second rank RANK2 (or the first semiconductor die 200).

By the first connection circuit 280, an output terminal OT1 of the first ODT control signal generation circuit 210 is connected with one of the first pin P1_1 and the second pin P1_2, and an input terminal IT1 of the first ODT circuit control circuit 250 is connected with the other of the first pin P1_1 and the second pin P1_2.

By the second connection circuit 380, an output terminal OT2 of the second ODT control signal generation circuit 310 is connected with one of the third pin P2_1 and the fourth pin P2_2, and an input terminal IT2 of the second ODT circuit control circuit 350 is connected with the other of the third pin P2_1 and the fourth pin P2_2.

Figure 4A:
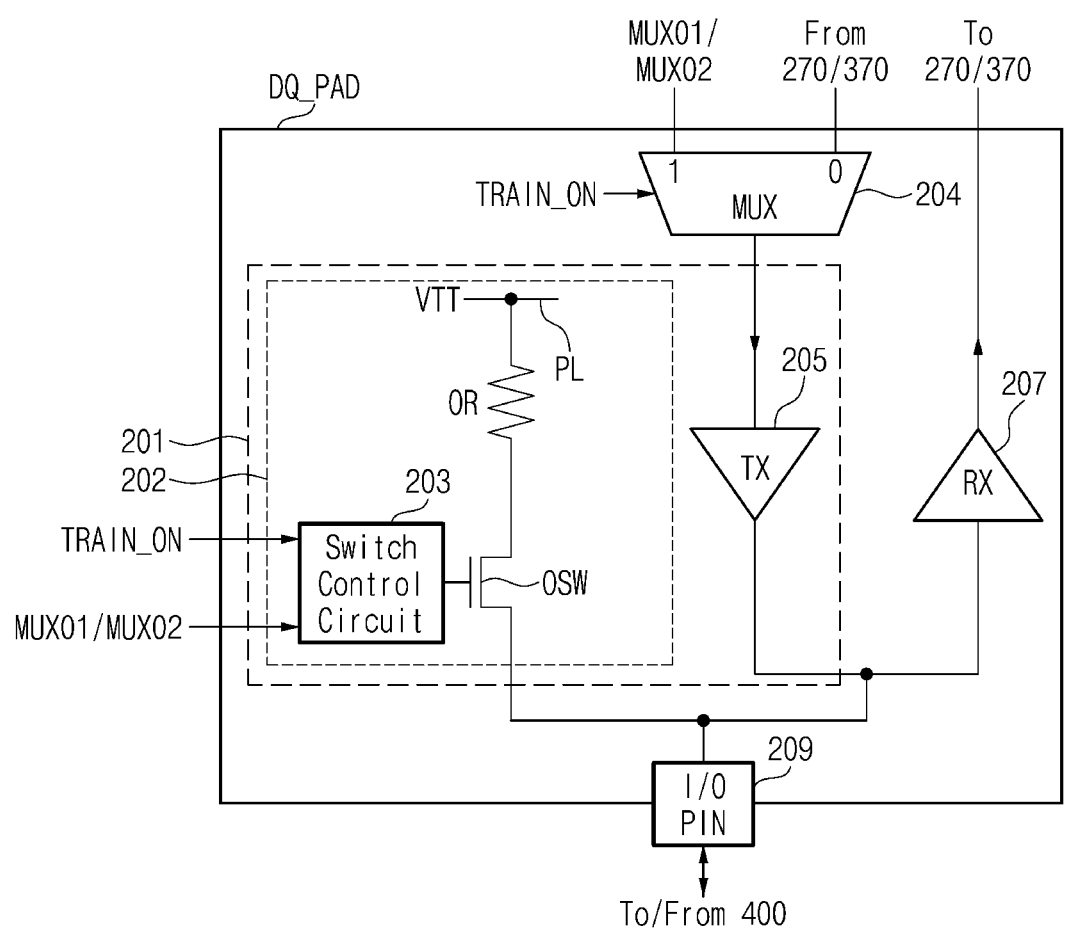
FIG. 4A is a conceptual diagram of a data input/output pad included in each semiconductor die of FIG. 1 and including an ODT circuit.

FIG. 4A is a conceptual diagram of a data input/output pad included in each semiconductor die of FIG. 1 and including an ODT circuit. Referring to FIGS. 1 to 4A, it is assumed that the data input/output pads LP1, LP4, UP1, and UP4 have the same structure.

Below, a data input/output pad DQ_PAD may be used to representatively (or collectively) express the data input/output pads LP1, LP4, UP1, and UP4. The data input/output pad DQ_PAD includes a transmit circuit 201, a select circuit 204, a receiver 207, and an input/output pin 209, and the transmit circuit 201 includes an ODT circuit 202 and a transmitter 205.

The memory controller 400 may be configured to exchange data with the corresponding memory cell array 270 or 370 through the input/output pin 209.

The ODT circuit 202 includes a switch control circuit 203, a resistor OR, and a switch OSW, and the resistor OR and the switch OSW is connected in series between a voltage supply line PL supplying a termination voltage VTT and the input/output pin 209.

The switch control circuit 203 turns on or turns off the switch OSW based on a level of the first selection signal TRAIN_ON and a level of an output signal MUXO1 or MUXO2 of the ODT circuit control circuit 250 or 350.

In a training mode where a training operation is performed, the level of the first selection signal TRAIN_ON is a first level (e.g., a high level); in a normal operation mode where a normal operation (e.g., a write operation or a read operation) is performed, the level of the first selection signal TRAIN_ON is a second level (e.g., a low level).

For example, when the training operation is not performed (i.e., when the level of the first selection signal TRAIN_ON is the low level or when the training function is disabled (or is set to "OFF")), the switch control circuit 203 turns off the switch OSW regardless of the level of the output signal MUXO1 or MUXO2. For example, the switch control circuit 203 may be implemented with an AND gate configured to receive the first selection signal TRAIN_ON and the output signal MUXO1 or MUXO2, but the present disclosure is not limited thereto.

According to an embodiment, the switch OSW may be implemented with an NMOS transistor or a PMOS transistor. For example, when the switch OSW is turned on, the resistor OR may be connected with the input/output pin 209, and thus, a resistance value of the ODT circuit 202 may be set to a resistance value (e.g., 40Ω) of the resistor OR.

The select circuit 204 is configured to output an output signal of the logic circuit and memory cell array 270 or 370 or the output signal MUXO1 or MUXO2 to the transmitter 205 based on the first selection signal TRAIN_ON.

For example, when the level of the first selection signal TRAIN_ON is the first level (i.e., when the training mode is enabled (or is set to "ON")), the select circuit 204 selects the output signal MUXO1 or MUXO2 to be provided to the memory controller 400 through the transmitter 205 and the input/output pin 209. However, when the level of the first selection signal TRAIN_ON is the second level (i.e., when the training mode is disabled (or is set to "OFF")), the select circuit 204 selects the output signal of the logic circuit and memory cell array 270 or 370 to be provided to the memory controller 400 through the transmitter 205 and the input/output pin 209.

For convenience of description, the data input/output pad DQ_PAD including the switch control circuit 203 and the select circuit 204 is illustrated in FIG. 4A as an example, but at least one of the switch control circuit 203 and the select circuit 204 may be included in the corresponding ODT circuit control circuit 250 or 350 in accordance with various embodiments.

Figure 4B:
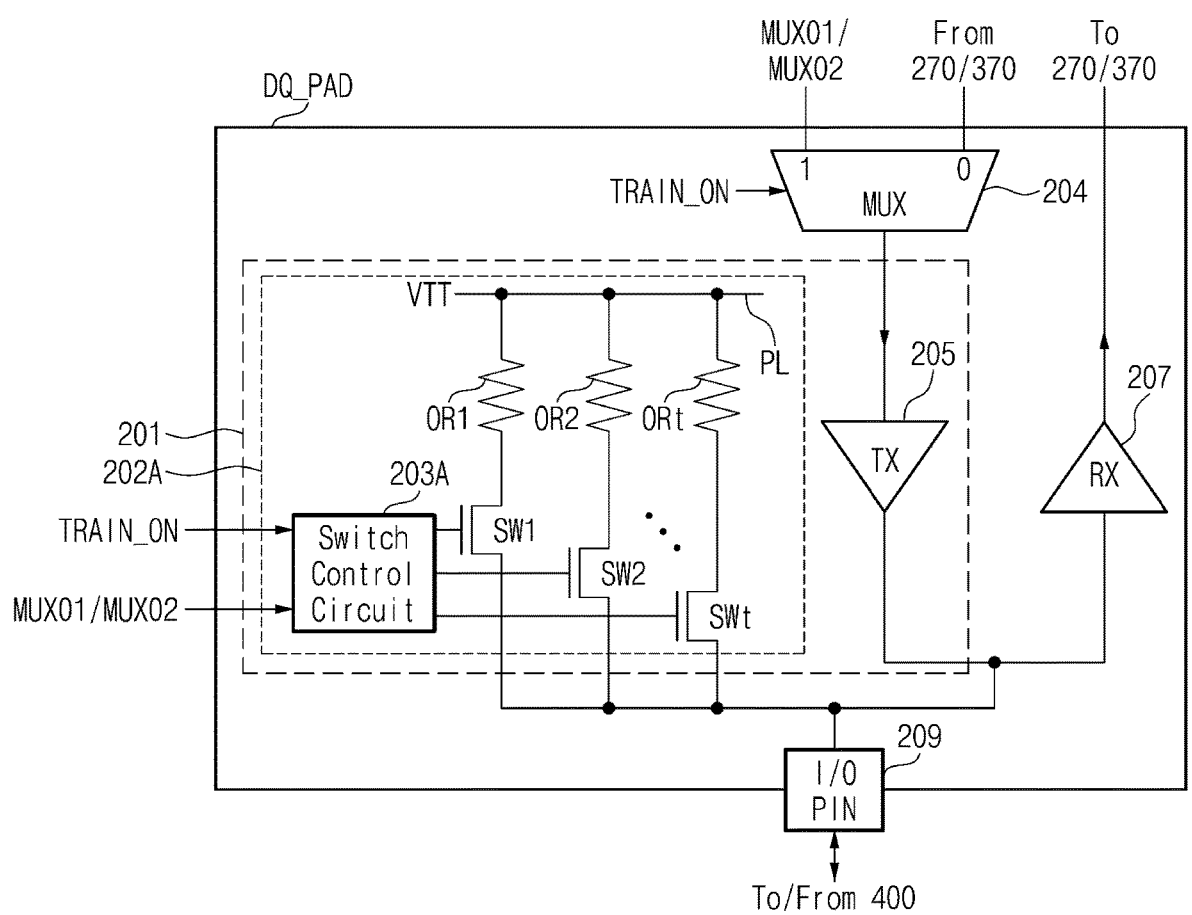
FIG. 4B is a conceptual diagram of a data input/output pad included in each semiconductor die of FIG. 1 and including an ODT circuit.

FIG. 4B is a conceptual diagram of a data input/output pad included in each semiconductor die of FIG. 1 and including an ODT circuit.

In FIGS. 1, 2, 3, and 4B, it is assumed that the data input/output pads LP1, LP4, UP1, and UP4 have the same structure.

Below, the data input/output pad DQ_PAD may be used to representatively (or collectively) express the data input/output pads LP1, LP4, UP1, and UP4. The data input/output pad DQ_PAD includes the transmit circuit 201, the select circuit 204, the receiver 207, and the input/output pin 209, and the transmit circuit 201 includes an ODT circuit 202A and the transmitter 205.

The ODT circuit 202A includes a switch control circuit 203A, resistors OR1 to ORt (t being a natural number of 2 or more), and switches SW1 to SWt.

The first resistor OR1 and the first switch SW1 are connected in series between the voltage supply line PL and the input/output pin 209; the second resistor OR2 and the second switch SW2 are connected in series between the voltage supply line PL and the input/output pin 209; the t-th resistor ORt and the t-th switch SWt are connected in series between the voltage supply line PL and the input/output pin 209.

The resistors OR1 to ORt may be designed to have different resistance values. Each of the switches SW1 to SWt may be implemented with an NMOS transistor or a PMOS transistor.

The switch control circuit 203A is configured to turn on or turn off the switches SW1 to SWt based on the level of the first selection signal TRAIN_ON and the level of the output signal MUXO1 or MUXO2 of the ODT circuit control circuit 250 or 350.

When at least one of the switches SW1 to SWt is turned on under control of the switch control circuit 203A, at least one of the resistors OR1 to ORt connected with the at least one turned-on switch is connected with the input/output pin 209. Accordingly, a resistance value of the ODT circuit 202A may be set to a specific value (e.g., 40Ω or 240Ω).

For example, when the training function is disabled (or is set to "OFF"), the switch control circuit 203A turns on at least one of the switches SW1 to SWt to set the resistance value of the ODT circuit 202A.

Below, the ODT circuit 202 or 202A included in each of the data input/output pads LP1 and LP4 of the first semiconductor die 200 is referred to as a "first ODT circuit", and the ODT circuit 202 or 202A included in each of the data input/output pads UP1 and UP4 of the second semiconductor die 300 is referred to as a "second ODT circuit".

The expression "to control the ODT of the ODT circuit 202 or 202A" means to turn off a switch (i.e., OSW or at least one of SW1 to SWt) included in the first ODT circuit or the second ODT circuit or to turn on the switch (i.e., OSW or at least one of SW1 to SWt) such that a resistance value of the first ODT circuit or the second ODT circuit is set to a specific resistance value or Hi-Z.

For convenience of description, the data input/output pad DQ_PAD including the switch control circuit 203A and the select circuit 204 is illustrated in FIG. 4B as an example, but at least one of the switch control circuit 203A and the select circuit 204 may be included in the corresponding ODT circuit control circuit 250 or 350 depending on embodiments.

When the structure of the data input/output pads LP1 and LP4 of the first semiconductor die 200 is identical to the structure of the data input/output pad DQ_PAD of FIG. 4A or 4B, the output signal MUXO1 of the first ODT circuit control circuit 250 is supplied to the data input/output pad DQ_PAD of FIG. 4A or 4B.

Also, when the structure of the data input/output pads UP1 and UP4 of the second semiconductor die 300 is identical to the structure of the data input/output pad DQ_PAD of FIG. 4A or 4B, the output signal MUXO2 of the second ODT circuit control circuit 350 is supplied to the data input/output pad DQ_PAD of FIG. 4A or 4B.

Figure 5:
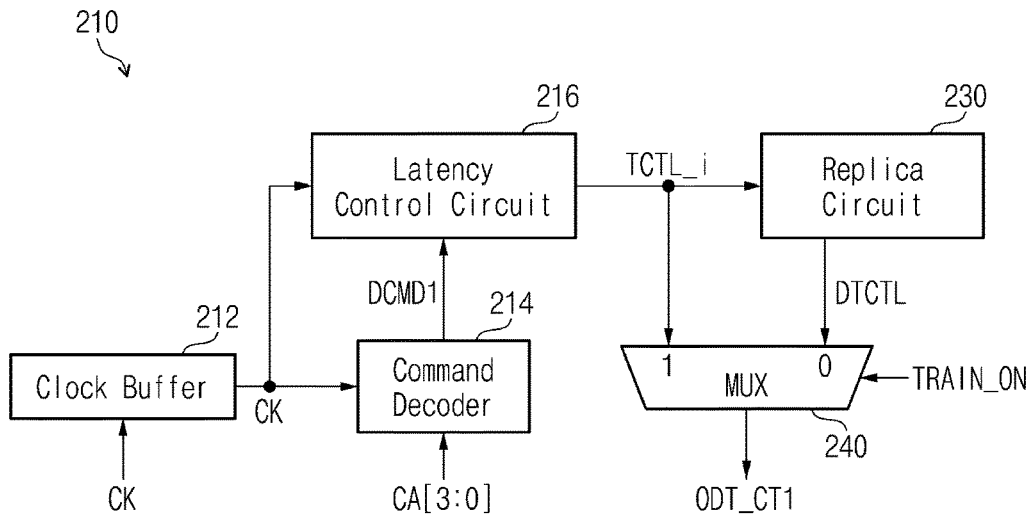
FIG. 5 is a block diagram of an ODT control signal generation circuit included in a first rank illustrated in FIG. 2.

FIG. 5 is a block diagram of an ODT control signal generation circuit included in a first rank illustrated in FIG. 2.

Referring to FIGS. 1 to 5, the first ODT control signal generation circuit 210 included in the first semiconductor die 200 includes a clock buffer 212, a command decoder 214, a latency control circuit 216, a replica circuit 230, and a first select circuit 240.

The clock buffer 212 is configured to buffer the clock signal CK input through the clock signal pad LP5 and is configured to output the buffered clock signal to the command decoder 214 and the latency control circuit 216. In the specification, for convenience of description, a clock signal and a buffered clock signal are marked by "CK."

The command decoder 214 is configured to generate a first decoded signal DCMD1 by decoding the command signals CA[3:0] received through the command/address pads LP6 by using the clock signal CK and is configured to output the first decoded signal DCMD1 to the latency control circuit 216.

Figure 6:
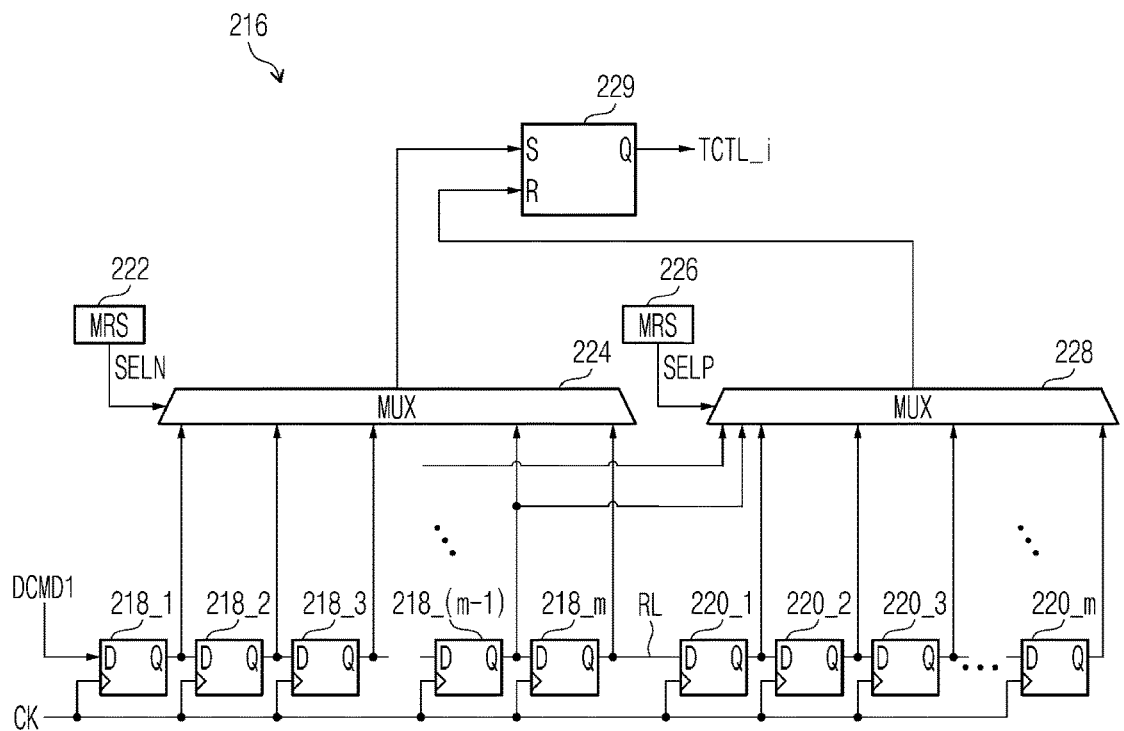
FIG. 6 illustrates an embodiment of a circuit diagram of a latency control circuit included in an ODT control signal generation circuit of FIG. 5.

FIG. 6 illustrates an embodiment of a circuit diagram of a latency control circuit included in an ODT control signal generation circuit of FIG. 5.

Referring to FIG. 6, the latency control circuit 216 includes a first group of flip-flops 218_1 to 218_m connected in series, a second group of flip-flops 220_1 to 220_m connected in series, a first memory device 222, a second select circuit 224, a second memory device 226, a third select circuit 228, and a pulse width determination circuit 229. Herein, m is a natural number of 4 or more. According to an embodiment, the number of flip-flops 218_1 to 218_m in the first group and the number of flip-flops 220_1 to 220_m in the second group may be different from each other.

The memory controller 400 may be configured to adjust (or set) values stored in memory devices (e.g., 222 and 226 of FIGS. 6 and/or 222' and 226' of FIG. 9) such that the latency or a pulse width (or referred to as an "activation interval") of a latency signal TCTL_i is adjusted (or set).

The clock signal CK buffered by the clock buffer 212 is supplied to a clock terminal of each of the flip-flops 218_1 to 218_m, and 220_1 to 220_m.

The first decoded signal DCMD1 is supplied to the input terminal "D" of the first flip-flop 218_1 in the first group, the output terminal "Q" of the first flip-flop 218_1 is connected with the input terminal "D" of the second flip-flop 218_2, and the output terminal "Q" of the (m-1)-th flip-flop 218_(m-1) is connected with the input terminal "D" of the m-th flip-flop 218_m.

It is assumed that a time delay from the first flip-flop 218_1 to the m-th flip-flop 218_m corresponds to a read latency RL.

The output terminal "Q" of the m-th flip-flop 218_m in the first group is connected with the input terminal "D" of the first flip-flop 220_1 in the second group, the output terminal "Q" of the first flip-flop 220_1 is connected with the input terminal "D" of the second flip-flop 220_2, and the output terminal "Q" of the (m-1)-th flip-flop 220_(m-1) is connected with the input terminal "D" of the m-th flip-flop 220_m.

The output signals of the flip-flops 218_1 to 218_m in the first group are provided to the second select circuit 224, and the output signal of at least one of the flip-flops 218_1 to 218_m in the first group is provided to the third select circuit 228. The number of flip-flops, the output signals of which are provided to the third select circuit 228, from among the flip-flops 218_1 to 218_m in the first group varies depending on a design specification.

The output signals of the flip-flops 220_1 to 220_m in the second group are provided to the third select circuit 228.

The second select circuit 224 is configured to provide the pulse width determination circuit 229 with the output signal of one of the flip-flops 218_1 to 218_m in the first group in response to the second selection signals SELN output from the first memory device 222.

The pulse width determination circuit 229 is configured to activate the latency signal TCTL_i based on the output signal of the second select circuit 224 and to deactivate the activated latency signal TCTL_i based on the output signal of the third select circuit 228.

The pulse width determination circuit 229 is configured to adjust (or determine) the pulse width of the latency signal TCTL_i by using the output signal (or an activation time point and a deactivation time point) of the second select circuit 224 and the output signal of the third select circuit 228.

The pulse width determination circuit 229 may be implemented with an SR latch 229. The second select circuit 224 is configured to provide the set input terminal "S" of the SR latch 229 with the output signal of one of the flip-flops 218_1 to 218_m in the first group based on the second selection signals SELN output from the first memory device 222. The first memory device 222 may be implemented with a mode register set.

For example, the control logic circuit 274 included in the first logic circuit and memory cell array 270 may be configured to receive data from the memory controller 400 and may be configured to store the data in the first memory device 222. The second selection signals SELN may be generated based on the data stored in the first memory device 222.

The third select circuit 228 is configured to provide the reset input terminal "R" of the SR latch 229 with the output signal of one of the flip-flops 218_1 to 218_m in the first group and the flip-flops 220_1 to 220_m in the second group based on the third selection signals SELP output from the second memory device 226. The second memory device 226 may be implemented with a mode register set. Each of the select circuits 224 and 228 may be implemented with a multiplexer.

For example, the control logic circuit 274 included in the first logic circuit and memory cell array 270 may be configured to receive data from the memory controller 400 and may be configured to store the data in the second memory device 226. The third selection signals SELP may be generated based on the data stored in the second memory device 226.

The latency signal TCTL_i output from the output terminal "Q" of the SR latch 229 is supplied to a first input terminal 1 of the first select circuit 240 and the replica circuit 230.

Figure 12:
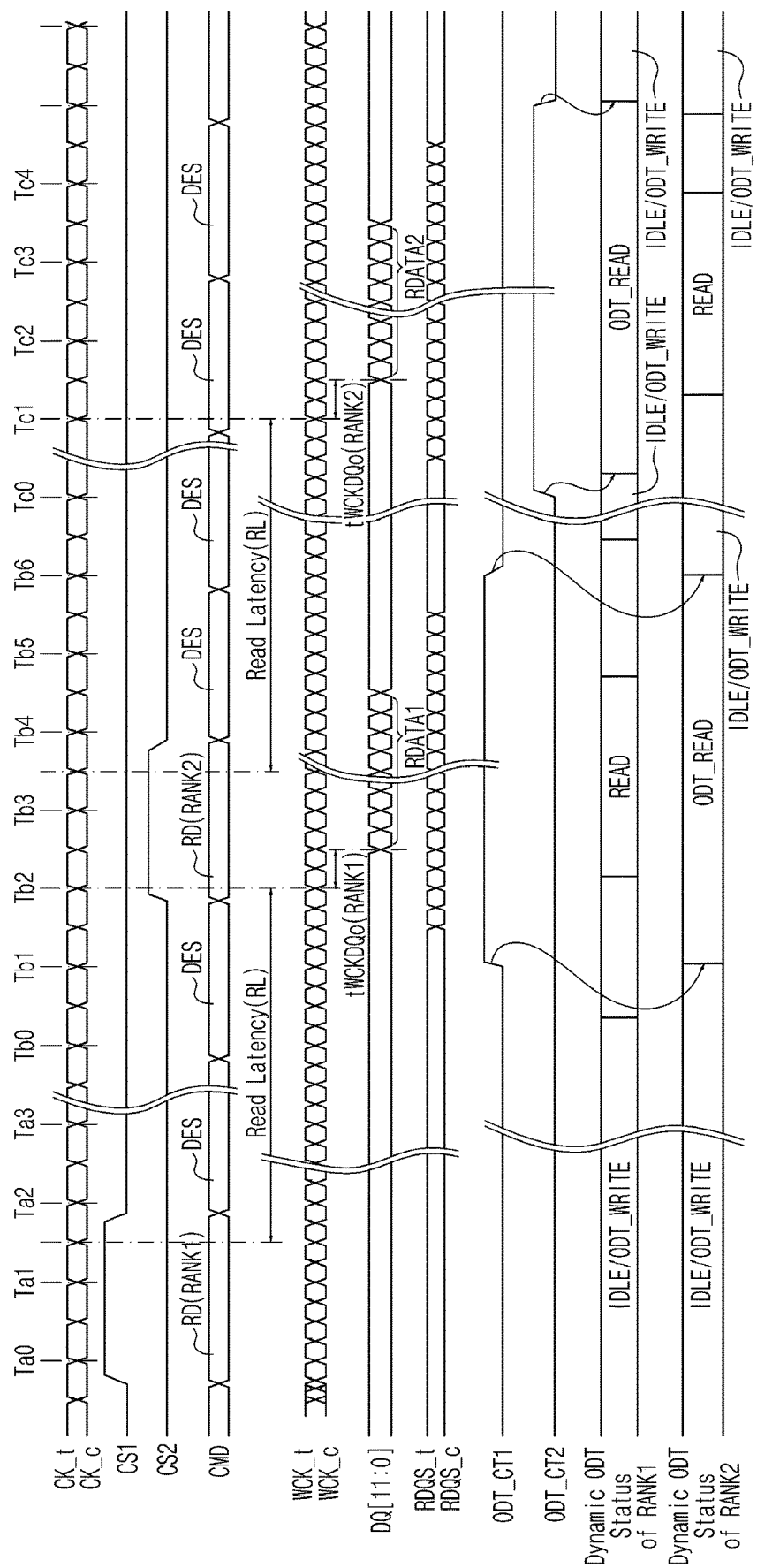
FIG. 12 is a timing diagram illustrating an operation of a memory system illustrated in FIG. 1.

The replica circuit 230 may be a delay circuit that is implemented to replicate a delay time tWCKDQo from a first time point corresponding to a specific rising edge of the write clock signal WCK to a second time point at which the first bit of data RDATA1 or RDATA2 corresponding to a burst length is output, as illustrated in FIG. 12.

Figure 7:
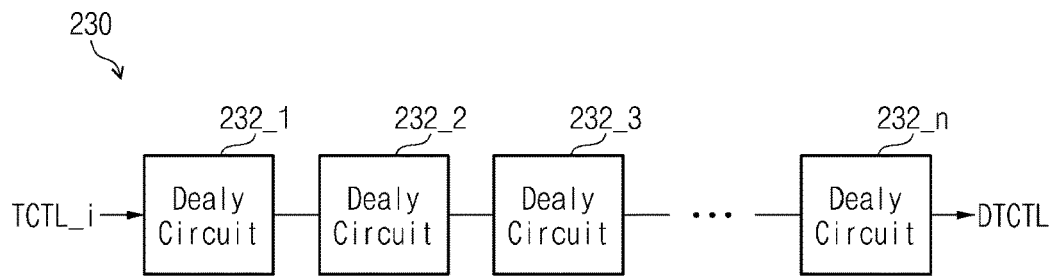
FIG. 7 illustrates an embodiment of a circuit diagram of a replica circuit included in an ODT control signal generation circuit of FIG. 5.

FIG. 7 illustrates an embodiment of a circuit diagram of a replica circuit included in an ODT control signal generation circuit of FIG. 5.

Referring to FIG. 7, the replica circuit 230 includes delay circuits 232_1 to 232_n (n being a natural number of 2 or more) connected in series. According to embodiments, each of the delay circuits 232_1 to 232_n may be implemented with a buffer or an inverter.

For example, the replica circuit 230 is configured to receive the latency signal TCTL_i output from the latency control circuit 216, to delay the latency signal TCTL_i as much as the given delay time tWCKDQo, and to supply a delayed latency signal DTCTL to a second input terminal 0 of the first select circuit 240. The first select circuit 240 may be implemented with a multiplexer.

The first select circuit 240 is configured to output the latency signal TCTL_i or the delayed latency signal DTCTL as the first ODT control signal ODT_CT1 based on the level of the first selection signal TRAIN_ON.

As illustrated in FIG. 2, during the training operation that is performed to adjust an activation time point of the first ODT control signal ODT_CT1 generated by the first semiconductor die 200 used as the first rank RANK1 and an activation time point of the second ODT control signal ODT_CT2 generated by the second semiconductor die 300 used as the second rank RANK2, the first selection signal TRAIN_ON is set to the first level (e.g., the high level).

Accordingly, in the training operation, the first select circuit 240 outputs the latency signal TCTL_i input to the first input terminal 1 as the first ODT control signal ODT_CT1 in response to the first selection signal TRAIN_ON of the first level.

However, when the training operation is not performed, the first selection signal TRAIN_ON is set to the second level. Accordingly, the first select circuit 240 outputs the delayed latency signal DTCTL input to the second input terminal 0 as the first ODT control signal ODT_CT1 in response to the first selection signal TRAIN_ON of the second level (e.g., the low level).

As described with reference to FIG. 2, the first ODT control signal ODT_CT1 generated from the first semiconductor die 200 used as the first rank RANK1 is transferred to the input terminal IT2 of the second ODT circuit control circuit 350 of the second semiconductor die 300 used as the second rank RANK2, through the components T11, T14, P1_1, TL1, 121, P2_1, T24, and T22.

Figure 8:
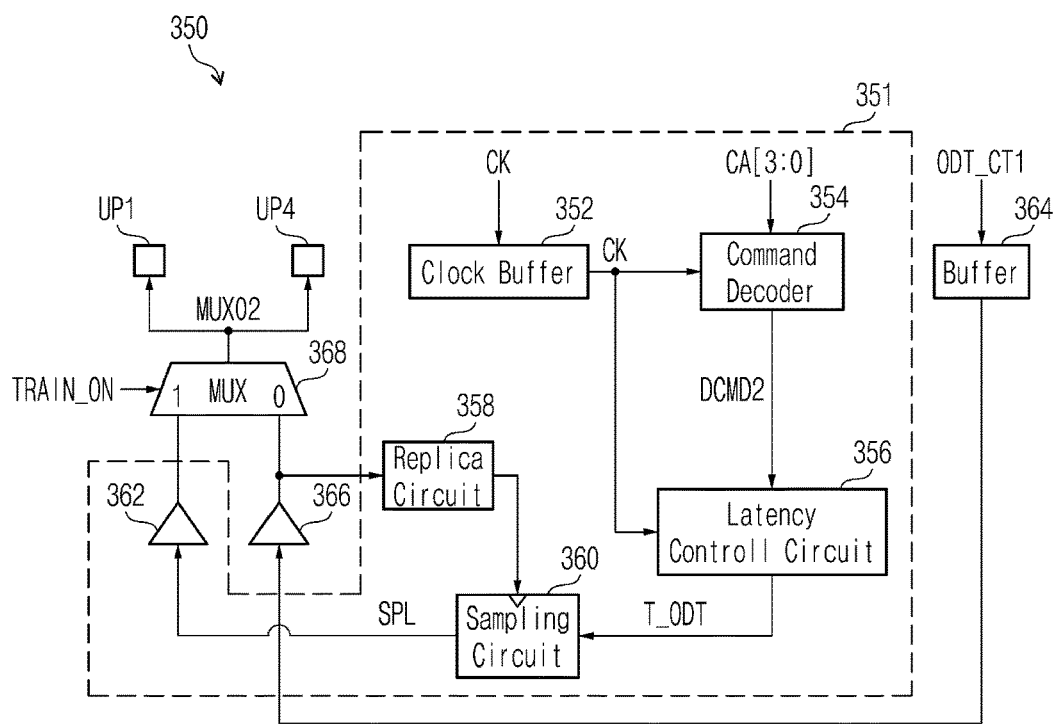
FIG. 8 illustrates an embodiment of a circuit diagram of an ODT circuit control circuit included in a second rank illustrated in FIG. 2.

FIG. 8 illustrates an embodiment of a circuit diagram of an ODT circuit control circuit included in a second rank illustrated in FIG. 2.

Referring to FIG. 8, the second ODT circuit control circuit 350 includes a training circuit 351, a first buffer 364, a third buffer 366, and a fourth select circuit 368.

The training circuit 351 includes a clock buffer 352, a command decoder 354, a latency control circuit 356, a replica circuit 358, a sampling circuit 360, and a second buffer 362.

The clock buffer 352 is configured to buffer the clock signal CK input through the clock signal pad UP5 and to output the buffered clock signal to the command decoder 354 and the latency control circuit 356. As described above, a clock signal and a buffered clock signal are marked by "CK".

The command decoder 354 is configured to generate a second decoded signal DCMD2 by decoding the command signals CA[3:0] received through the command/address pads UP6 by using the clock signal CK and to output the second decoded signal DCMD2 to the latency control circuit 356.

Figure 9:
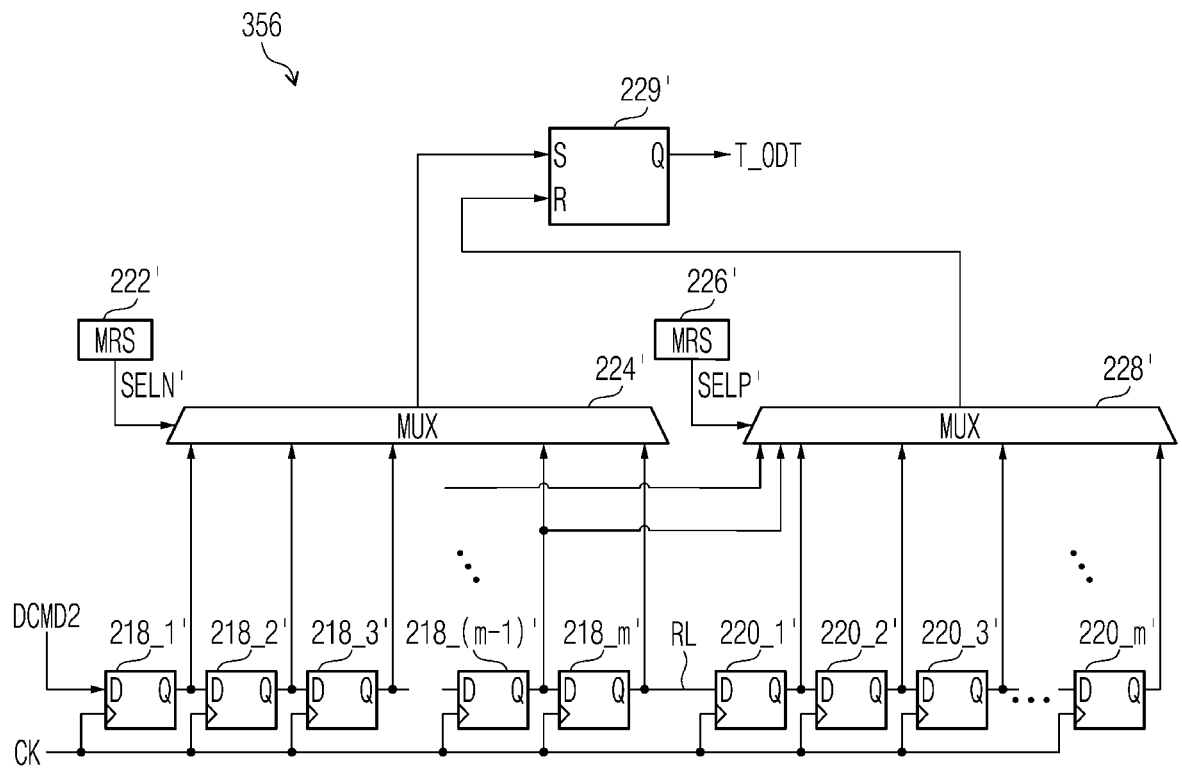
FIG. 9 illustrates an embodiment of a circuit diagram of a latency control circuit included in an ODT circuit control circuit illustrated in FIG. 8.

FIG. 9 illustrates an embodiment of a circuit diagram of a latency control circuit included in an ODT circuit control circuit illustrated in FIG. 8.

Referring to FIGS. 6 and 9, a structure and an operation of the latency control circuit 356 illustrated in FIG. 9 are identical to the structure and the operation of the latency control circuit 216 illustrated in FIG. 6 except for the input/output signals DCMD1, DCMD2, TCTL_i, and T_ODT and reference signs.

Figure 10:
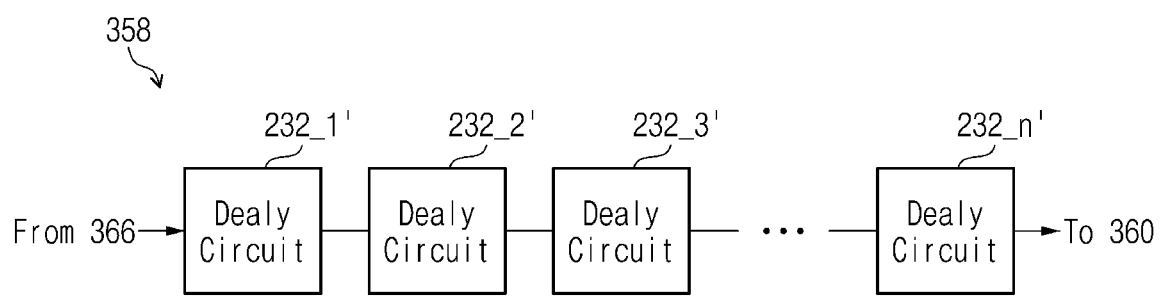
FIG. 10 illustrates an embodiment of a circuit diagram of a replica circuit included in an ODT circuit control circuit illustrated in FIG. 8.

FIG. 10 illustrates an embodiment of a circuit diagram of a replica circuit included in an ODT circuit control circuit illustrated in FIG. 8.

Referring to FIGS. 7 and 10, a structure and an operation of the replica circuit 358 illustrated in FIG. 10 are identical to the structure and the operation of the replica circuit 230 illustrated in FIG. 7 except for reference signs and except that the input terminal of a first delay circuit 232_1' of the replica circuit 358 is connected to the output terminal of the third buffer 366 and the output terminal of an n-th delay circuit 232_n' of the replica circuit 358 is connected to the control terminal of the sampling circuit 360.

Figure 11:
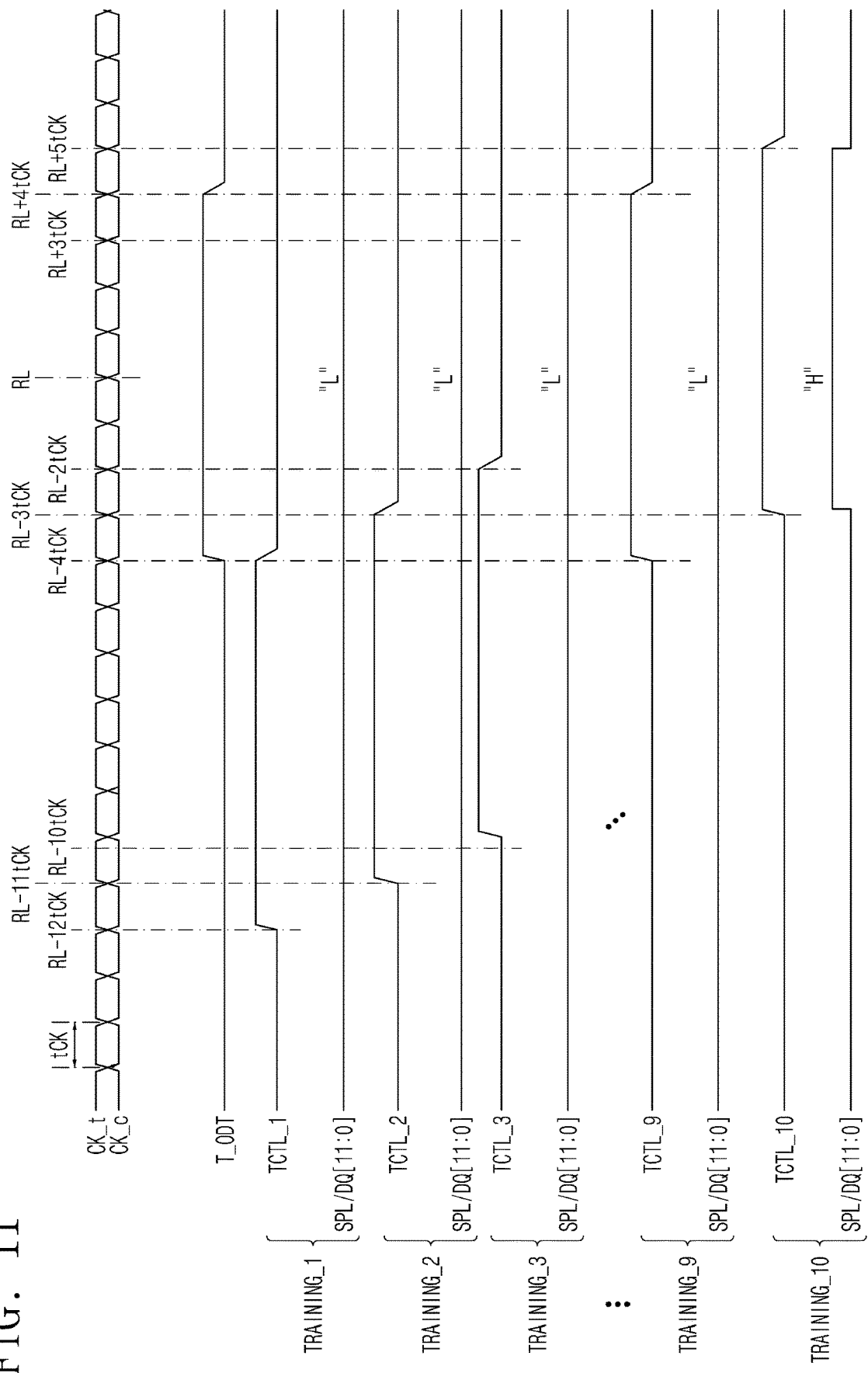
FIG. 11 is a timing diagram illustrating a method of training a first ODT control signal by using an ODT circuit control circuit illustrated in FIG. 8.

FIG. 11 is a timing diagram illustrating a method of training a first ODT control signal by using an ODT circuit control circuit illustrated in FIG. 8.

Referring to FIGS. 1 to 3, the delay occurs in the process where the first ODT control signal ODT_CT1 being an asynchronous signal generated in the first semiconductor die 200 is transferred to the second semiconductor die 300 through off-chip connections (e.g., TL1 and 121), and the delay occurs in the process where the second ODT control signal ODT_CT2 being an asynchronous signal generated in the second semiconductor die 300 is transferred to the first semiconductor die 200 through off-chip connections (e.g., TL2 and 123).

The ODT control signal generation circuits 210 and 310 of the dis 200 and 300 are configured to adjust (or set) activation and deactivation time points of the ODT control signals ODT_CT1 and ODT_CT2 in consideration of the above delays.

The process of training the timing of the first ODT control signal ODT_CT1 that is activated before the first bit of the first read data RDATA1 corresponding to the burst length in the first semiconductor die 200 used as the first rank RANK1 performing the read operation and is deactivated after the last bit of the first read data RDATA1 is output will be described in detail with reference to FIGS. 1, 2, and 4A to 12.

Herein, an activation means the transition (or change) from the second level to the first level, and a deactivation means the transition (or change) from the first level to the second level.

Below, embodiments will be described under the following assumption: to generate a reference ODT signal T_ODT, which has an activation interval from (RL−4tCK) to (RL+4tCK), with respect to the read data corresponding the burst length, the memory controller 400 transfers a first value and a second value to the second semiconductor die 300 used as the second rank RANK2, the control logic circuit 374 of the second semiconductor die 300 stores the first value in the third memory device 222' of the latency control circuit 356 of FIG. 8 and stores the second value in the fourth memory device 226'. Herein, tCK is a period of the clock signal CK and represents a training resolution.

In the specification, a value means digital signals associated with the generation of selection signals (i.e., SELN and SELP of FIG. 6 and SELN' and SELP' of FIG. 9).

It is assumed that the command decoder 354 of FIG. 8 decodes the command signals CA[3:0] to generate the second decoded signal DCMD2 activated, it is assumed that in the training mode, the control logic circuit 274 or 374 of the semiconductor die 200 or 300 generates the first selection signal TRAIN_ON of the first level, and it is assumed that the command signals CA[3:0] are command signals for the read operation.

Also, for convenience of description, it is assumed that the number of flip-flops 218_1 to 218_m and 218_1' to 218_m' in the first group and the number of flip-flops 220_1 to 220_m and 220_1' to 220_m' in the second group are 13 (i.e., m=13).

The fifth select circuit 224' included in the latency control circuit 356 of FIG. 9 outputs the output signal RL−4tCK of the ninth flip-flop 218_9' in the first group to the set input terminal "S" of the SR latch 229' in response to the fifth selection signals SELN' that are generated based on the first value present in the third memory device 222'. Accordingly, as illustrated in FIG. 11, the reference ODT signal T_ODT is activated.

The sixth select circuit 228' included in the second latency control circuit 356 of FIG. 9 outputs the output signal RL+4tCK of the fourth flip-flop 220_4' in the second group to the reset input terminal "R" of the SR latch 229' in response to the sixth selection signals SELP' that are generated based on the second value present in the fourth memory device 226'. Accordingly, as illustrated in FIG. 11, the reference ODT signal T_ODT is deactivated.

That is, as illustrated in FIG. 11, the pulse width of the reference ODT signal T_ODT corresponds to an interval from (RL−4tCK) to (RL+4tCK). Herein, CK_t and CK_c are differential clock signals.

Below, embodiments will be described under the following assumption: the memory controller 400 transfers a third value and a fourth value to the first semiconductor die 200 used as the first rank RANK1, the control logic circuit 274 of the first semiconductor die 200 stores the third value in the first memory device 222 of the latency control circuit 216 of FIG. 6 and stores the fourth value in the second memory device 226.

In a first training operation TRAINING_1, the select circuit 224 included in the first latency control circuit 216 of FIG. 6 outputs the output signal RL−12tCK of the first flip-flop 218_1 in the first group to the set input terminal "S" of the SR latch 229' in response to the second selection signals SELN that are generated based on the third value present in the first memory device 222.

The third select circuit 228 included in the first latency control circuit 216 of FIG. 6 outputs the output signal RL−4tCK of the ninth flip-flop 218_9 in the first group to the reset input terminal "R" of the SR latch 229 in response to the third selection signals SELP that are generated based on the fourth value present in the second memory device 226. As illustrated in FIG. 11, in the first training operation TRAINING_1, the pulse width of the first latency signal TCTL_i (i=1) corresponds to an interval from (RL−12tCK) to (RL−4tCK).

For convenience of description, the delay of the first buffer 364 of FIG. 8, the delay of the third buffer 366 of FIG. 8, and the delay tWCKDQo of the replica circuit 358 of FIG. 8 are not illustrated.

In the first training operation TRAINING_1, the sampling circuit 360 samples the reference ODT signal T_ODT by using the rising edge of the first latency signal TCTL_1. According to an embodiment, the sampling circuit 360 may be implemented with a D-flip-flop.

The sampling circuit 360 outputs a sampling signal SPL at a low level to the second buffer 362. The fourth select circuit 368 of FIG. 8 outputs the output signal (i.e., the output signal at a low level) of the second buffer 362 to the data input/output pads UP1 and UP4 in response to the first selection signal TRAIN_ON at the first level. According to an embodiment, the data input/output pads UP1 and UP4 are implemented as described with reference to FIG. 4A or 4B.

The memory controller 400 receives the data DQ[11:0] output from the data input/output pads UP1 and UP4 of the second semiconductor die 300 in an asynchronous manner; when each of the bits included in the data DQ[11:0] is at a low level (or data "0"), the memory controller 400 determines that a second training operation TRAINING_2 will be performed and transfers a fifth value and a sixth value to the first semiconductor die 200 used as the first rank RANK1.

The control logic circuit 274 of the first semiconductor die 200 stores the fifth value in the first memory device 222 included in the first latency control circuit 216 of FIG. 6 and stores the sixth value in the second memory device 226 included therein.

In the second training operation TRAINING_2, the second select circuit 224 included in the first latency control circuit 216 of FIG. 6 outputs the output signal RL−11tCK of the second flip-flop 218_2 in the first group to the set input terminal "S" of the SR latch 229 in response to the second selection signals SELN that are generated based on the fifth value present in the first memory device 222.

The third select circuit 228 included in the first latency control circuit 216 of FIG. 6 outputs the output signal RL−3tCK of the tenth flip-flop 218_10 in the first group to the reset input terminal "R" of the SR latch 229 in response to the third selection signals SELP that are generated based on the sixth value present in the second memory device 226. As illustrated in FIG. 11, in the second training operation TRAINING_2, the pulse width of the second latency signal TCTL_i (i=2) corresponds to an interval from (RL−11tCK) to (RL−3tCK).

In the second training operation TRAINING_2, the sampling circuit 360 samples the reference ODT signal T_ODT by using the rising edge of the second latency signal TCTL_2.

The sampling circuit 360 outputs the sampling signal SPL at a low level to the second buffer 362. The fourth select circuit 368 of FIG. 8 outputs the output signal (i.e. the output signal at a low level) of the second buffer 362 to the data input/output pads UP1 and UP4 in response to the first selection signal TRAIN_ON at the first level.

The memory controller 400 receives the data DQ[11:0] output from the data input/output pads UP1 and UP4 of the second semiconductor die 300 in an asynchronous manner; when each of bits included in the data DQ[11:0] is at the low level, the memory controller 400 determines that a third training operation TRAINING 3 will be performed and transfers a seventh value and an eighth value to the first semiconductor die 200 used as the first rank RANK1.

In the same manner as the first training operation TRAINING_1 and the second training operation TRAINING_2, the third training operation TRAINING 3 to an eighth training operation TRAINING_8 are sequentially performed.

The memory controller 400 receives the data DQ[11:0] output from the data input/output pads UP1 and UP4 of the second semiconductor die 300 based on a result of the eighth training operation TRAINING_8; when each of bits included in the data DQ[11:0] is at a low level, the memory controller 400 determines that a ninth training operation TRAINING_9 will be performed and transfers a 19th value and a 20th value to the first semiconductor die 200 used as the first rank RANK1.

In the ninth training operation TRAINING_9, the second select circuit 224 included in the first latency control circuit 216 of FIG. 6 outputs the output signal RL−4tCK of the ninth flip-flop 218_9 in the first group to the set input terminal "S" of the SR latch 229 in response to the second selection signals SELN that are generated based on the 19th value present in the first memory device 222.

The third select circuit 228 included in the first latency control circuit 216 of FIG. 6 outputs the output signal RL+4tCK of the fourth flip-flop 220_4 in the second group to the reset input terminal "R" of the SR latch 229 in response to the third selection signals SELP that are generated based on the 20th value present in the second memory device 226. As illustrated in FIG. 11, in the ninth training operation TRAINING_9, the pulse width of the ninth latency signal TCTL_i (i=9) corresponds to an interval from (RL−4tCK) to (RL+4tCK).

In the ninth training operation TRAINING_9, the sampling circuit 360 samples the reference ODT signal T_ODT by using the rising edge of the ninth latency signal TCTL_9. According to embodiments, the sampling circuit 360 may output the sampling signal SPL at a high level; however, as illustrated in FIG. 11, it is assumed that the sampling circuit 360 outputs the sampling signal SPL at a low level.

The sampling circuit 360 outputs the sampling signal SPL at a low level to the second buffer 362. The fourth select circuit 368 of FIG. 8 outputs the output signal (i.e. the output signal at a low level) of the second buffer 362 to the data input/output pads UP1 and UP4 in response to the first selection signal TRAIN_ON at the first level.

The memory controller 400 receives the data DQ[11:0] output from the data input/output pads UP1 and UP4 of the second semiconductor die 300 in an asynchronous manner based on a result of the ninth training operation TRAINING_9; when each of bits included in the data DQ[11:0] is at a low level, the memory controller 400 determines that a tenth training operation TRAINING_10 will be performed and transfers a 21st value and a 22nd value to the first semiconductor die 200 used as the first rank RANK1. In each of the first to tenth training operations TRAINING_1 to TRAINING_10, the resolution is 1tCK.

In the tenth training operation TRAINING_10, the second select circuit 224 included in the first latency control circuit 216 of FIG. 6 outputs the output signal RL−3tCK of the tenth flip-flop 218_10 in the first group to the set input terminal "S" of the SR latch 229 in response to the second selection signals SELN that are generated based on the 21st value present in the first memory device 222.

The third select circuit 228 included in the first latency control circuit 216 of FIG. 6 outputs the output signal RL+5tCK of the fifth flip-flop 220_5 in the second group to the reset input terminal "R" of the SR latch 229 in response to the third selection signals SELP that are generated based on the 22nd value present in the second memory device 226.

As illustrated in FIG. 11, in the tenth training operation TRAINING_10, the pulse width of the tenth latency signal TCTL_i (i=10) corresponds to an interval from (RL−3tCK) to (RL+5tCK).

In the tenth training operation TRAINING_10, the sampling circuit 360 samples the reference ODT signal T_ODT by using the rising edge of the tenth latency signal TCTL_10.

The sampling circuit 360 outputs the sampling signal SPL at a high level to the second buffer 362. The fourth select circuit 368 of FIG. 8 outputs the output signal of the second buffer 362, that is, the output signal at a high level to the data input/output pads UP1 and UP4 in response to the first selection signal TRAIN_ON at the first level.

The memory controller 400 receives the data DQ[11:0] output from the data input/output pads UP1 and UP4 of the second semiconductor die 300 based on a result of the tenth training operation TRAINING_10; because each of the bits included in the data DQ[11:0] is at a high level, the memory controller 400 determines that an additional training operation will be stopped from being performed.

For example, when a training target is (RL−4tCK), an error of a maximum of 1tck may occur. Even though the error occurs, the first ODT control signal generation circuit 210 is activated before the first bit of the first read data RDATA1 corresponding to the burst length is output and is deactivated after the last bit of the first read data RDATA1 is output. As such, the second ODT circuit control circuit 350 of the second semiconductor die 300 may control the ODT of the second ODT circuit included in each of the data input/output pads UP1 and UP4 at (RL−3tCK).

In the same manner as the first training operation TRAINING_1 to the tenth training operation TRAINING_10 illustrated in FIG. 11, the first ODT circuit control circuit 250 may adjust the pulse width of the second ODT control signal ODT_CT2 that are output from the second ODT control signal generation circuit 310 (or the activation time point of the second ODT control signal ODT_CT2 and the deactivation time point of the second ODT control signal ODT_CT2).

When a normal operation (e.g., a write operation or a read operation) is performed in each of the semiconductor dies 200 and 300, each of the control logic circuits 274 and 374 of the semiconductor dies 200 and 300 generates the first selection signal TRAIN_ON a the second level.

When a read operation is performed in the first semiconductor die 200, the latency control circuit 216 of the first ODT control signal generation circuit 210 in FIG. 5 outputs, to the replica circuit 230, the tenth latency signal TCTL_10 with the pulse width from (RL−3tCK) to (RL+5tCK) as illustrated in FIG. 11 as an example.

The replica circuit 230 delays the tenth latency signal TCTL_10 as much as the delay time tWCKDQo and output the delayed latency signal DTCTL to the first select circuit 240.

The first select circuit 240 outputs the delayed latency signal DTCTL as the first ODT control signal ODT_CT1 based on the first selection signal TRAIN_ON at the second level. Accordingly, the first ODT control signal ODT_CT1 is activated at time point "(RL−3tCK)+tWCKDQo".

As illustrated in FIG. 2, the first ODT control signal ODT_CT1 is transferred to the input terminal IT2 of the second ODT circuit control circuit 350 of the second semiconductor die 300 through the components T11, T14, P1_1, TL1, 121, P2_1, T24, and T22.

The first buffer 364 illustrated in FIG. 8 receives and buffers the first ODT control signal ODT_CT1 transferred from the first semiconductor die 200 and outputs the first ODT control signal ODT_CT1 thus buffered to the third buffer 366.

The fourth select circuit 368 outputs the output signal ODT_CT1 of the third buffer 366 to the data input/output pads UP1 and UP4 based on the first selection signal TRAIN_ON of the second level.

Referring to FIG. 4A, the switch control circuit 203 controls the turn-on or turn-off of the switch OSW based on the level of the first selection signal TRAIN_ON and the output signal MUXO2 of the fourth select circuit 368.

Also, referring to FIG. 4B, the switch control circuit 203A controls the turn-on or turn-off of the switches SW1 to SWt based on the level of the first selection signal TRAIN_ON and the level of the output signal MUXO2 of the fourth select circuit 368.

FIG. 12 is a timing diagram illustrating an operation of a memory system illustrated in FIG. 1.

Referring to FIGS. 1, 2, and 12, a first semiconductor die selection signal CS1 output from the memory controller 400 is a signal that may be used for controlling the enable of the first semiconductor die 200, and a second semiconductor die selection signal CS2 output from the memory controller 400 is a signal that may be used for controlling the enable of the second semiconductor die 300.

In FIG. 12, RD (RANK1) indicates a first read command CMD for the first rank RANK1; RD (RANK2) indicates a second read command CMD for the second rank RANK2; DES indicates deselect; WCK_t and WCK_c indicate differential write clock signals; DQ[11:0] indicates read data RDATA1 or RDATA2 transferred from the first semiconductor die 200 or the second semiconductor die 300 to the memory controller 400; and, RDQS t and RDQS_c indicate differential read data strobe signals. In FIGS. 12, Ta0 to Ta3, Tb0 to Tb6, and Tc0 to Tc4 indicate time points.

Below, the description will be given with reference to FIGS. 1, 2, and 4A to 12 under the assumption that the memory controller 400 outputs the first read command RD(RANK1) to the first semiconductor die 200 used as the first rank RANK1 and then outputs the second read command RD(RANK2) to the second semiconductor die 300 used as the second rank RANK2. A ratio of WCK to CK may be 2:1 or 4:1, but an example where the ratio of WCK to CK is 2:1 is illustrated in FIG. 12.

When the read operation is performed in the first semiconductor die 200, the first ODT control signal generation circuit 210 generates the first ODT control signal ODT_CT1 that is activated before the first bit of the first read data RDATA1 is output and is deactivated after the last bit of the first read data RDATA1 is output and outputs the first ODT control signal ODT_CT1 to the second ODT circuit control circuit 350 of the second semiconductor die 300 through the components T11, T14, P1_1, TL1, 121, P2_1, T24, and T22.

As such, because the first buffer 364 of the second ODT circuit control circuit 350 illustrated in FIG. 8 receives and buffers the first ODT control signal ODT_CT1 and outputs the first ODT control signal ODT_CT1 thus buffered to the third buffer 366, the ODT of the second ODT circuit included in each of the data input/output pads UP1 and UP4 of the second semiconductor die 300 that does not perform the read operation while the read operation is performed in the first semiconductor die 200 is set to an ODT read operation state ODT_READ.

As illustrated in FIG. 12, when the level of the corresponding ODT control signal ODT_CT1 or ODT_CT2 is at a low level, the ODT of the ODT circuit included in each of the input/output pads LP1 and LP4 or UP1 and UP4 of the corresponding semiconductor die 200 or 300 is set to an idle state IDLE or an ODT write operation state ODT WRITE.

FIG. 13 illustrates a table including ODT control results of an ODT circuit for respective operation states of a target and a non-target.

A target rank TARGET means a rank where the read operation or the write operation is being currently performed, a non-target rank NON-TARGET means a rank where the read operation or the write operation is not currently performed. Accordingly, when one of the semiconductor dies 200 and 300 is the target rank TARGET, the other of the semiconductor dies 200 and 300 is the non-target rank NON-TARGET.

The ODT control signal ODT_CT1/ODT_CT2 that is transferred from the target rank TARGET to the non-target rank NON-TARGET provides a function of notifying the non-target rank NON-TARGET whether the read operation or the write operation is performed in the target rank TARGET and a function of controlling the ODT of the ODT circuit included in each of the data input/output pads of the non-target rank NON-TARGET.

As illustrated in FIGS. 12 and 13, in the idle state IDLE, the ODT of the first ODT circuit included in each of the data input/output pads LP1 and LP4 of the first semiconductor die 200 corresponding to the target rank TARGET has a first resistance value (e.g., 40Ω), and the ODT of the second ODT circuit included in each of the data input/output pads UP1 and UP4 of the second semiconductor die 300 corresponding to the non-target rank NON-TARGET has the first resistance value (e.g., 40Ω).

As illustrated in FIGS. 12 and 13, in the write operation state WRITE or the ODT write operation state ODT WRITE, the ODT of the first ODT circuit included in each of the data input/output pads LP1 and LP4 of the first semiconductor die 200 corresponding to the target rank TARGET is in an off state OFF, and the ODT of the second ODT circuit included in each of the data input/output pads UP1 and UP4 of the second semiconductor die 300 corresponding to the non-target rank NON-TARGET has the first resistance value (e.g., 40Ω).

As illustrated in FIGS. 12 and 13, in the read operation state READ or the ODT read operation state ODT_READ, the ODT of the first ODT circuit included in each of the data input/output pads LP1 and LP4 (collectively DQ_PAD) of the first semiconductor die 200 corresponding to the target rank TARGET is in the off state OFF, and the ODT of the second ODT circuit included in each of the data input/output pads UP1 and UP4 of the second semiconductor die 300 corresponding to the non-target rank NON-TARGET is in the off state OFF or has a second resistance value (e.g., 240Ω).

As illustrated in FIGS. 12 and 13, the ODT read operation state ODT_READ associated with the second semiconductor die 300 means that even though the second semiconductor die 300 is the non-target rank NON-TARGET, the second semiconductor die 300 controls the ODT of the second ODT circuit included in each of the data input/output pads UP1 and UP4 (collectively DQ_PAD) based on the first ODT control signal ODT_CT1 from the first semiconductor die 200 to be set to the off state OFF or to have the second resistance value (e.g., 240Ω).

In contrast, while the read operation for the second semiconductor die 300 is performed, the second ODT control signal generation circuit 310 generates the second ODT control signal ODT_CT2 that is activated before the first bit of the second read data RDATA2 is output and is deactivated after the last bit of the second read data RDATA2 is output and outputs the second ODT control signal ODT_CT2 to the first ODT circuit control circuit 250 of the first semiconductor die 200 through the components T21, T23, P2_2, TL2, 123, P1_2, T13, and T12.

Accordingly, as described with reference to FIG. 8, because the first buffer 364 of the first ODT circuit control circuit 250 receives and buffers the second ODT control signal ODT_CT2 and outputs the second ODT control signal ODT_CT2 thus buffered to the third buffer 366, the ODT of the first ODT circuit included in each of the data input/output pads LP1 and LP4 of the first semiconductor die 200 is set to the ODT read operation state ODT_READ.

The ODT read operation state ODT_READ associated with the first semiconductor die 200, which is illustrated in FIGS. 12 and 13, means that even though the first semiconductor die 200 is the non-target rank NON-TARGET, the first semiconductor die 200 controls the ODT of the first ODT circuit included in each of the data input/output pads LP1 and LP4 (collectively DQ_PAD) based on the second ODT control signal ODT_CT2 from the second semiconductor die 300 to be set to the off state OFF or to have the second resistance value (e.g., 240Ω).

Referring to FIGS. 4A, 4B, 8, 12, and 13, it may be understood that according to some embodiments, a method may be provided in which the ODT of the ODT circuit of each of the target rank TARGET and the non-target rank NON-TARGET is set to 40Ω, OFF, or 240Ω in each of the operation states IDEL, WRITE, ODT WRITE, READ, and ODT_READ.

As illustrated in FIG. 12, in the normal mode where the level of the second ODT control signal ODT_CT2 is at a low level, the ODT of the first ODT circuit included in each of the input/output pads LP1 and LP4 of the first semiconductor die 200 is set to the idle state IDLE or the ODT write operation state ODT WRITE.

As described above, as an ODT control signal ODT_CT1 or ODT_CT2 generated in a target rank (one of RANK1 and RANK2) is transferred to a non-target rank (the other of RANK1 and RANK2) in an asynchronous manner, the non-target rank does not need to separately decode command signals associated with the read operation or the write operation and also does not need to internally generate a switch control signal for controlling the ODT of the ODT circuit included in each of data input/output pads included in the non-target rank. Accordingly, the power consumption of the non-target rank may be reduced.

The timing diagram associated with the time points at which the first ODT control signal ODT_CT1 or the second ODT control signal ODT_CT2 is activated and deactivated when the read operation is performed in the first semiconductor die 200 or the second semiconductor die 300 is illustrated in FIG. 12 as an example, but embodiments of the present disclosure may be applied to a timing diagram associated with time points at which the first ODT control signal ODT_CT1 or the second ODT control signal ODT_CT2 is activated and deactivated when the write operation is performed in the first semiconductor die 200 or the second semiconductor die 300.

For example, the timing of the first ODT control signal ODT_CT1 may be adjusted such that the first ODT control signal ODT_CT1 is activated before the first bit of first write data is transferred to the first semiconductor die 200 and is deactivated after the last bit of the first write data is transferred to the first semiconductor die 200. Also, the timing of the second ODT control signal ODT_CT2 may be adjusted such that the second ODT control signal ODT_CT2 is activated before the first bit of second write data is transferred to the second semiconductor die 300 and is deactivated after the last bit of the second write data is transferred to the second semiconductor die 300.

FIG. 14 is a block diagram of a data processing system including a memory system illustrated in FIG. 1. Referring to FIGS. 1 and 14, a data processing system 500A may be a system on chip (SoC), a CPU 510A may include the memory controller 400 and may be configured to control an operation of the memory controller 400. According to embodiments, the memory controller 400 may be disposed outside of or external to the CPU 510A.

FIG. 15 is a block diagram of a data processing system including a memory system illustrated in FIG. 1. Referring to FIGS. 1 and 15, a data processing system 501 may include a SoC 500B and the memory device 110, the SoC 510B may include a CPU 510B and the memory controller 400, and the memory device 110 may be disposed outside of or external to the SoC 500B.

The CPUs 510A and 510B illustrated in FIGS. 14 and 15 may be a processor or application processor, the data processing system 500A or 501 may be included in a mobile device, and the mobile device may include, but is not limited to, a smartphone, a laptop computer, a wearable computer, an Internet of Things (IoT) device, or a drone.

When the read operation or the write operation is performed in a semiconductor die according to an embodiment of the present disclosure, the semiconductor die may asynchronously generate a signal providing notification that a read operation or a write operation is performed, such as an on-die termination (ODT) control signal, and may transfer the ODT control signal to another semiconductor die through a dedicated pin, and the other semiconductor die may control an ODT of an ODT circuit included in each of input/output pads of the another semiconductor die by using the ODT control signal. Accordingly, power consumption of the other semiconductor die may be reduced.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A semiconductor die comprising:
a first pin configured to output a first on-die termination (ODT) control signal to a second semiconductor die, the second semiconductor die comprising a plurality of second ODT circuits each having an ODT that is responsive to the first ODT control signal; and
a second pin configured to receive a second ODT control signal output from the second semiconductor die, the semiconductor die comprising a plurality of first ODT circuits each having an ODT that is responsive to the second ODT control signal.

2. The semiconductor die of claim 1, further comprising:
an ODT control signal generation circuit configured to:
generate the first ODT control signal, which is activated before a first bit of read data corresponding to a burst length is output from the semiconductor die when performing a first read operation and is deactivated after a last bit of the read data is output; and
output the first ODT control signal to the first pin.

3. The semiconductor die of claim 2, further comprising:
data input/output pads; and
an ODT circuit control circuit configured to control the ODT of each of the first ODT circuits respectively included in the data input/output pads based on the second ODT control signal transferred from the second semiconductor die when performing a second read operation.

4. The semiconductor die of claim 3, further comprising:
a connection circuit configured to:
transfer the first ODT control signal generated by the ODT control signal generation circuit to the first pin; and
transfer the second ODT control signal received through the second pin to the ODT control signal generation circuit.

5. A multi-chip package comprising:
a first semiconductor die; and
a second semiconductor die,
wherein the first semiconductor die includes:
a first pin configured to output a first on-die termination (ODT) control signal to the second semiconductor die, the second semiconductor die comprising a plurality of second ODT circuits each having an ODT that is responsive to the first ODT control signal; and
a second pin configured to receive a second ODT control signal output from the second semiconductor die, the first semiconductor die comprising a plurality of first ODT circuits each having an ODT that is responsive to the second ODT control signal.

6. The multi-chip package of claim 5, wherein the first semiconductor die further includes:
a first ODT control signal generation circuit configured to:
generate the first ODT control signal, which is activated before a first bit of read data corresponding to a burst length is output from the first semiconductor die when performing a first read operation and is deactivated after a last bit of the read data is output; and
output the first ODT control signal to the first pin.

7. The multi-chip package of claim 6, wherein the first semiconductor die further includes:
first data input/output pads; and
a first ODT circuit control circuit configured to control the ODT of each of the first ODT circuits respectively included in the data input/output pads based on the second ODT control signal transferred from the second semiconductor die when performing a second read operation.

8. The multi-chip package of claim 7, wherein the first semiconductor die further includes a connection circuit configured to:
transfer the first ODT control signal generated by the first ODT control signal generation circuit to the first pin; and
transfer the second ODT control signal received through the second pin to the first ODT circuit control circuit.

9. The multi-chip package of claim 7, wherein the second semiconductor die includes:
a third pin configured to receive the first ODT control signal output from the first semiconductor die; and
a fourth pin configured to output the second ODT control signal to the first semiconductor die.

10. The multi-chip package of claim 9, further comprising:
a printed circuit board including a first PCB pin and a second PCB pin;
a first transmission line connecting the first pin, the first PCB pin, and the third pin; and a second transmission line connecting the second pin, the second PCB pin, and the fourth pin.

11. The multi-chip package of claim 9, wherein the second semiconductor die further includes a second ODT control signal generation circuit configured to:
generate the second ODT control signal, which is activated before a first bit of read data corresponding to a burst length is output from the second semiconductor die when performing a first read operation and is deactivated after a last bit of the read data is output; and
output the second ODT control signal to the fourth pin.

12. The multi-chip package of claim 11, wherein the second semiconductor die further includes:
second data input/output pads; and
a second ODT circuit control circuit configured to control the ODT of each of the second ODT circuits respectively included in the data input/output pads based on the first ODT control signal transferred from the first semiconductor die when performing a second read operation.

13. The multi-chip package of claim 12, wherein the second semiconductor die further includes a connection circuit configured to:
transfer the second ODT control signal generated by the second ODT control signal generation circuit to the fourth pin; and
transfer the first ODT control signal received through the third pin to the second ODT circuit control circuit.

14. A memory system comprising:
a multi-chip package including a first semiconductor die and a second semiconductor die; and
a memory controller configured to control an operation of the multi-chip package,
wherein the first semiconductor die includes:
a first pin configured to output a first on-die termination (ODT) control signal to the second semiconductor die, the second semiconductor die comprising a plurality of second ODT circuits each having an ODT that is responsive to the first ODT control signal; and
a second pin configured to receive a second ODT control signal output from the second semiconductor die, the first semiconductor die comprising a plurality of first ODT circuits each having an ODT that is responsive to the second ODT control signal.

15. The memory system of claim 14, wherein the second semiconductor die includes:
a third pin configured to receive the first ODT control signal output from the first semiconductor die; and
a fourth pin configured to output the second ODT control signal to the first semiconductor die.

16. The memory system of claim 15, wherein the multi-chip package further includes:
a printed circuit board including a first PCB pin and a second PCB pin;
a first transmission line connecting the first pin, the first PCB pin, and the third pin; and
a second transmission line connecting the second pin, the second PCB pin, and the fourth pin.

17. The memory system of claim 15, wherein, when a second read operation is not performed in the second semiconductor die while a first read operation is performed in the first semiconductor die, the first semiconductor die further includes:
an ODT control signal generation circuit configured to:
generate the first ODT control signal, which is activated before a first bit of read data corresponding to a burst length is output from the first semiconductor die and is deactivated after a last bit of the read data is output; and
output the first ODT control signal to the first pin.

18. The memory system of claim 17, wherein the second semiconductor die further includes:
data input/output pads; and
an ODT circuit control circuit configured to control the ODT of each of the second ODT circuits respectively included in the data input/output pads based on the first ODT control signal received through the third pin, to be set in an ODT read operation state.

19. The memory system of claim 15, wherein, when a first read operation is not performed in the first semiconductor die while a second read operation is performed in the second semiconductor die, the second semiconductor die further includes:
an ODT control signal generation circuit configured to:
generate the second ODT control signal, which is activated before a first bit of read data corresponding to a burst length is output from the second semiconductor die and is deactivated after a last bit of the read data is output; and
output the second ODT control signal to the fourth pin.

20. The memory system of claim 19, wherein the first semiconductor die further includes:
data input/output pads; and
an ODT circuit control circuit configured to control the ODT of each of the first ODT circuits respectively included in the data input/output pads based on the second ODT control signal received through the second pin, to be set in an ODT read operation state.

* * * * *